(12) United States Patent
Hyun et al.

(10) Patent No.: US 12,396,331 B2
(45) Date of Patent: Aug. 19, 2025

(54) DISPLAY DEVICE AND METHOD OF PROVIDING THE SAME

(71) Applicant: Samsung Display Co., LTD., Yongin-si (KR)

(72) Inventors: Jin Ho Hyun, Gwacheon-si (KR); Hee Chang Yoon, Anyang-si (KR); Hyoung Sub Lee, Yongin-si (KR); Hye Min Lee, Gimpo-si (KR); Woo Yong Sung, Seoul (KR); Seung Yong Song, Suwon-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 481 days.

(21) Appl. No.: 17/745,271

(22) Filed: May 16, 2022

(65) Prior Publication Data

US 2023/0083430 A1    Mar. 16, 2023

(30) Foreign Application Priority Data

Sep. 13, 2021  (KR) .......................... 10-2021-0121487

(51) Int. Cl.
  *H10K 59/122*  (2023.01)
  *H10K 50/844*  (2023.01)
  (Continued)

(52) U.S. Cl.
  CPC ......... *H10K 59/122* (2023.02); *H10K 50/844* (2023.02); *H10K 71/00* (2023.02); *H10K 59/1201* (2023.02)

(58) Field of Classification Search
  CPC .... H10K 59/122; H10K 71/00; H10K 50/844; H10K 59/1201
  See application file for complete search history.

(56) References Cited

U.S. PATENT DOCUMENTS

| 7,279,708 | B2 * | 10/2007 | Kwak | ................... | H01L 27/124 |
| | | | | | 438/149 |
| 7,385,347 | B2 * | 6/2008  | Song | ................. | H10K 50/8426 |
| | | | | | 313/506 |

(Continued)

FOREIGN PATENT DOCUMENTS

| CN | 112420896 A | 2/2021 |
| EP | 3933930 A1 | 1/2022 |

(Continued)

OTHER PUBLICATIONS

European Search Report for European Patent Application No. 221941680.9 dated Jan. 31, 2023.

*Primary Examiner* — Richard A Booth
(74) *Attorney, Agent, or Firm* — CANTOR COLBURN LLP

(57) ABSTRACT

A display device includes a substrate which includes a base part and a protruding pattern which protrudes from the base part, a pixel electrode which is on the protruding pattern, a pixel defining layer which is d on the pixel electrode and exposes the pixel electrode, a light emitting layer which is on the pixel electrode exposed by the pixel defining layer, a common electrode which is on the light emitting layer, a first inorganic encapsulation layer which is on the common electrode, a second inorganic encapsulation layer which is on the first inorganic encapsulation layer, and an overcoat layer which is on the second inorganic encapsulation layer. The pixel defining layer defines a light emitting area, and the first inorganic encapsulation layer and the second inorganic encapsulation layer are in direct contact with each other in the light emitting area.

17 Claims, 14 Drawing Sheets

(51) Int. Cl.
*H10K 59/12* (2023.01)
*H10K 71/00* (2023.01)

(56) References Cited

U.S. PATENT DOCUMENTS

| | | | |
|---|---|---|---|
| 10,872,935 | B2 | 12/2020 | Kim et al. |
| 11,264,435 | B2 | 3/2022 | Kim et al. |
| 12,183,768 | B2 * | 12/2024 | Jang .................... H01L 23/4985 |
| 2020/0142449 | A1 | 5/2020 | Nakatogawa |
| 2020/0152708 | A1 | 5/2020 | Kim et al. |
| 2020/0373372 | A1 | 11/2020 | Chung et al. |
| 2021/0066440 | A1 | 3/2021 | Okabe et al. |

FOREIGN PATENT DOCUMENTS

| | | |
|---|---|---|
| KR | 20200055992 A | 5/2020 |
| KR | 1020200144628 A | 12/2020 |

* cited by examiner

LEL1 : 171,172,173

DISPLAY DEVICE AND METHOD OF PROVIDING THE SAME

This application claims priority to Korean Patent Application No. 10-2021-0121487, filed on Sep. 13, 2021, and all the benefits accruing therefrom under 35 U.S.C. § 119, the content of which in its entirety is herein incorporated by reference.

BACKGROUND

1. Field

Embodiments of the invention relate to a display device and a method of providing (or manufacturing) the same.

2. Description of the Related Art

As the information society develops, demands for display devices for displaying images are increasing in various forms. For example, display devices are applied to various electronic devices such as smartphones, digital cameras, notebook computers, navigation devices, and smart televisions.

As display devices, various types of display devices such as liquid crystal displays (LCDs) and organic light emitting displays (OLEDs) are used. Among them, an OLED displays an image using an organic light emitting element that generates light through recombination of electrons and holes. The OLED includes a plurality of transistors that provide a driving current to the organic light emitting element, As display devices are applied to various electronic devices, display devices having various designs are developed, For example, a display device may display an image not only on a front part of the display device, but also on parts respectively bent from one or more edges of the front part and/or a corner part between the bending parts.

SUMMARY

Embodiments of the invention provide a display device having improved reliability.

However, aspects of the present disclosure are not restricted to the one set forth herein. The above and other aspects of the present disclosure will become more apparent to one of ordinary skill in the art to which the present disclosure pertains by referencing the detailed description of the present disclosure given below.

An embodiment of the invention provides a display device including a substrate which includes a base part and a protruding pattern which protrudes from the base part, a pixel electrode which is on the protruding pattern, a pixel defining layer which is on the pixel electrode and exposes the pixel electrode, a light emitting layer which is on the pixel electrode exposed by the pixel defining layer, a common electrode which is on the light emitting layer, a first inorganic encapsulation layer which is on the common electrode, a second inorganic encapsulation layer which is on the first inorganic encapsulation layer, and an overcoat layer which is on the second inorganic encapsulation layer. The pixel defining layer defines a light emitting area, and the first inorganic encapsulation layer and the second inorganic encapsulation layer are in direct contact with each other in the light emitting area.

In an embodiment, the overcoat layer may include at least any one of a negative type sensitizer and a positive type sensitizer.

In an embodiment, the display device may further include an inorganic layer which is on the overcoat layer.

In an embodiment, the display device may further include a planarization layer which is between the protruding pattern and the pixel electrode, and a recess pattern which is defined by the pixel defining layer together with the planarization layer. The first inorganic encapsulation layer and the second inorganic encapsulation layer may be in the recess pattern and may be in direct contact with each other in the recess pattern.

In an embodiment, the display device may further include an etch stop pattern which is between the planarization layer and the protruding pattern. The recess pattern may expose the etch stop pattern.

In an embodiment, the display device may further include a dummy light emitting layer which includes a same material as the light emitting layer, and a dummy common electrode which includes a same material as the common electrode. The dummy light emitting layer and the dummy common electrode may be between the etch stop pattern and the first inorganic encapsulation layer.

In an embodiment, the recess pattern may surround the light emitting area in a plan view.

In an embodiment, the protruding pattern may include a double curvature.

In an embodiment, the protruding pattern may be provided in plural numbers, and a plurality of protruding patterns face each other.

In an embodiment, the display device may further include a display area, and a non-display area which is around the display area. The display area may include a front part, a first side part extending and bending from the front part to one side in a first direction, a second side part extending and bending from the front part to one side in a second direction intersecting the first direction and a corner part between the first side part and the second side part. The protruding pattern may be in the corner part.

An embodiment of the invention provides a display device including a substrate which includes a base part, and a protruding pattern which protrudes from the base part, a plurality of first pixels which are on the base part, each of the plurality of first pixels including a light emitting layer, a plurality of second pixels which are on the protruding pattern, each of the plurality of second pixels includes a light emitting layer, a first inorganic encapsulation layer which is on the second pixels, and an organic layer which is on the first inorganic encapsulation layer and includes at least any one of a negative type sensitizer and a positive type sensitizer.

In an embodiment, the display device may further include a second inorganic encapsulation layer which is on the first inorganic encapsulation layer. The second inorganic encapsulation layer may be between the first inorganic encapsulation layer and the organic layer.

In an embodiment, the first inorganic encapsulation layer and the second inorganic encapsulation layer may be in direct contact with each other in an area overlapping the light emitting layer of each of the second pixels.

In an embodiment, the display device may further include a second inorganic encapsulation layer which is on the first inorganic encapsulation layer. The organic layer may be between the first inorganic encapsulation layer and the second inorganic encapsulation layer.

In an embodiment, the protruding pattern may include a double curvature.

In an embodiment, the protruding pattern may be provided in plural numbers, and a plurality of protruding patterns face each other.

In an embodiment, the display device may further include a display area, and a non-display area which is around the display area. The display area may include a front part, a first side part extending and bending from the front part to one side in a first direction, a second side part extending and bending from the front part to one side in a second direction intersecting the first direction and a corner part between the first side part and the second side part. The protruding pattern may be in the corner part.

An embodiment of the invention provides a method of manufacturing (or providing) a display device, the method including forming (or providing) a pixel electrode which is on a substrate, forming a pixel defining layer which is on the pixel electrode and exposes the pixel electrode, forming a common electrode which is on the pixel electrode exposed by the pixel defining layer, forming a first inorganic encapsulation layer which is on the common electrode and an organic photosensitive layer which is on the first inorganic encapsulation layer, and exposing and developing the organic photosensitive layer. The organic photosensitive layer may include at least any one of a negative type sensitizer and a positive type sensitizer.

In an embodiment, the forming of the first inorganic encapsulation layer and the organic photosensitive layer may include forming a second inorganic encapsulation layer which is between the first inorganic encapsulation layer and the organic photosensitive layer and is in direct contact with the first inorganic encapsulation layer in a light emitting area defined by the pixel defining layer.

In an embodiment, the forming of the first inorganic encapsulation layer and the organic photosensitive layer may include forming the organic photosensitive layer on a plurality of protruding patterns protruding from the base part of the substrate.

BRIEF DESCRIPTION OF THE DRAWINGS

These and/or other features of the invention will become apparent and more readily appreciated from the following description of the embodiments, taken in conjunction with the accompanying drawings, in which.

DETAILED DESCRIPTION

Figure 1:
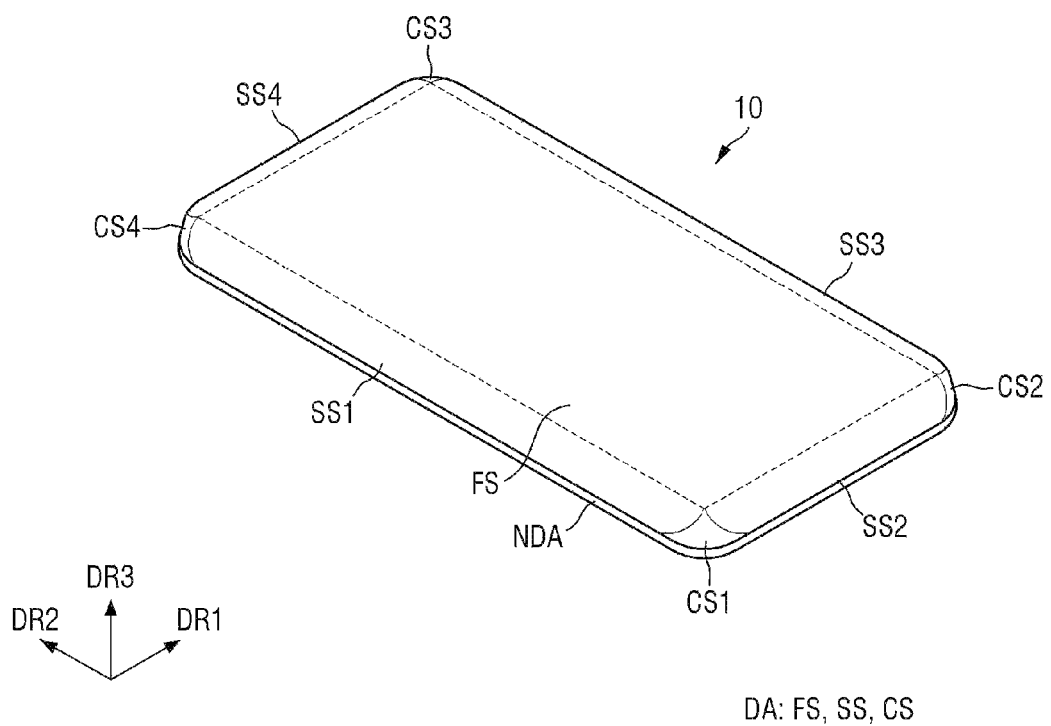
FIG. 1 is a perspective view of a display device according to an embodiment.

Embodiments of the invention will now be described more fully hereinafter with reference to the accompanying drawings, in which embodiments of the invention are shown. The invention may, however, be embodied in different forms and should not be construed as limited to the embodiments set forth herein. Rather, these embodiments are provided so that this disclosure will be thorough and complete, and will fully convey the scope of the invention to those skilled in the art.

The same reference numbers indicate the same components throughout the specification. As used herein, a reference number may indicate a singular element or a plurality of the element. For example, a reference number labeling a singular form of an element within the drawing figures may be used to reference a plurality of the singular element within the text of specification. In the attached drawing figures, the thickness of layers and regions is exaggerated for clarity.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

It will also be understood that when a layer is referred to as being related to another element such as being "on" another layer or substrate, it can be directly on the other layer or substrate, or intervening layers may also be present. In contrast, when an element is referred to as being related to another element such as being "directly on" another element, there are no intervening elements present.

The terminology used herein is for the purpose of describing particular embodiments only and is not intended to be limiting. As used herein, the singular forms "a," "an," and "the" are intended to include the plural forms, including "at least one," unless the content clearly indicates otherwise. "Or" means "and/or." "At least one of A and B" means "A and/or B." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The terms "below" or "beneath" can, therefore, encompass both an orientation of above and below.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10% or 5% of the stated value.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the disclosure, and will not be interpreted in an idealized or overly formal sense unless expressly so defined herein.

Embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. A region illustrated or described as flat may, typically, have rough and/or nonlinear features, for example. Moreover, sharp angles that are illustrated may be rounded. Thus, the regions illustrated in the drawing figures are schematic in nature and their shapes are not intended to illustrate the precise shape of a region and are not intended to limit the scope of the claims.

Hereinafter, embodiments of the invention will be described in detail with reference to the accompanying drawings.

Figure 2:
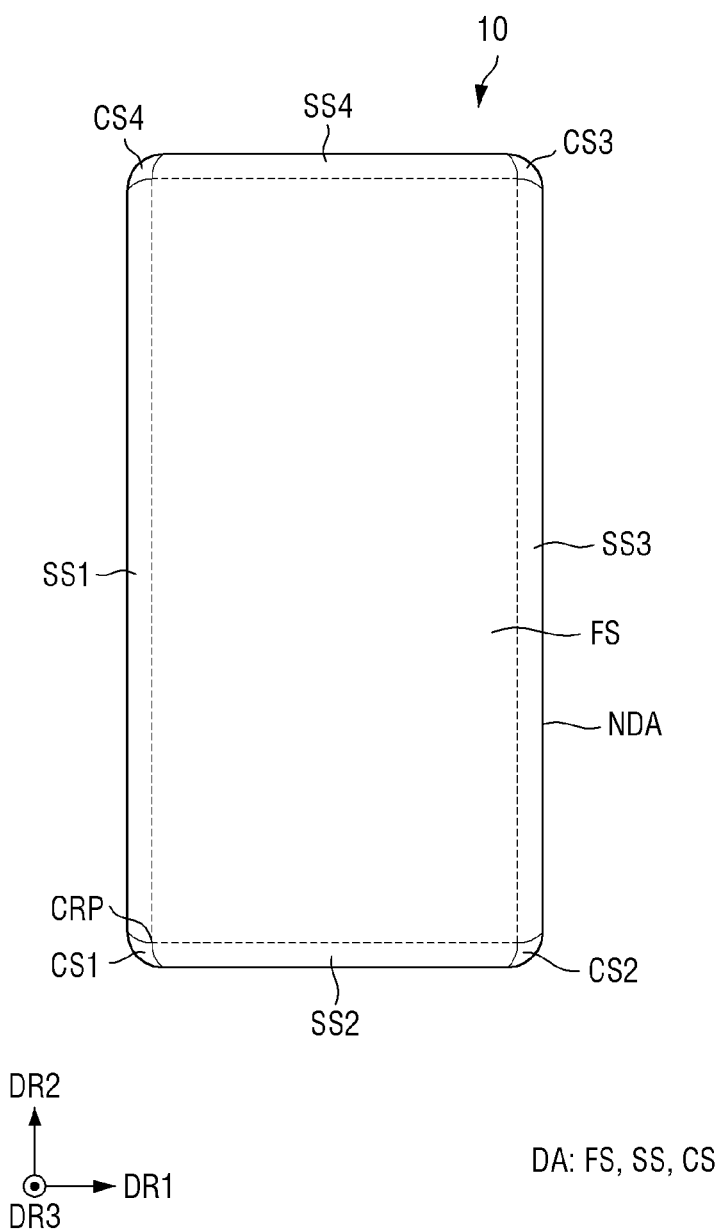
FIG. 2 is a plan view of the display device of FIG. 1.

FIG. 1 is a perspective view of a display device 10 according to an embodiment. FIG. 2 is a plan view of the display device 10 of FIG. 1.

Referring to FIGS. 1 and 2, the display device 10 according to the embodiment provides a display screen and/or displays an image through a display area DA (see FIG. 3) which will be described later, and examples of the display device 10 may include various devices including the display area DA (see FIG. 3). For example, the display device 10 according to embodiments of the present specification may be applied to smartphones, mobile phones, tablet personal computers (PCs), personal digital assistants (PDAs), portable multimedia players (PMPs), televisions, game machines, wristwatch-type electronic devices, head mounted displays, monitors of PCs, notebook computers, car navigation systems, car dashboards, digital cameras, camcorders, external billboards, electronic boards, medical devices, examination devices, various home appliances such as refrigerators and washing machines, and Internet of things (IoT) devices.

In the present specification, short sides of the display device 10 may extend in a direction parallel to a first direction DR1 in a plan view, and long sides of the display device 10 may extend in a direction parallel to a second direction DR2 in the plan view. In an embodiment, for example, the first direction DR1 and the second direction DR2 may intersect each other, such as perpendicularly intersecting to each other. The first direction DR1 may be a horizontal direction of the display device 10 in a plan view, and the second direction DR2 may be a vertical direction of the display device 10 in the plan view. A plane may be defined by the first direction DR1 and the second direction DR2 crossing each other. A third direction DR3 may be a direction crossing the first direction DR1 and the second direction DR2. In an embodiment, for example, the third direction DR3 may be a thickness direction of the display device 10, and may be perpendicular (e.g., normal) to a plane defined by the first direction DR1 and the second direction DR2 crossing each other.

The display device 10 may include the display area DA and a non-display area NDA.

The display area DA may display an image. The display area DA may include pixels and/or light emitting areas. The display area DA may include a front part FS, side parts SS (SS1 through SS4), and corner parts CS (CS1 through CS4).

The entire area of the front part FS may be substantially flat. However, the present disclosure is not limited thereto, and at least a part of the front part FS may also be convex or concave in the thickness direction (the third direction DR3). The front part FS may include a quadrangular shape having short sides in the first direction DR1 and long sides in the second direction DR2. The front part FS may have rounded corners in a plan view. The front part FS may have a polygonal shape with rounded corners in the plan view. In an embodiment, for example, as illustrated in FIG. 1, the front part FS may have a quadrangular shape with rounded corners, but the present disclosure is not limited thereto.

The side parts SS (SS1 through SS4) may extend outward from edges of the front part FS, and may be bent at an angle relative to the front part FS. In an embodiment, for example, the side parts SS may be bent at an angle of about 90 degrees to less than about 180 degrees, with respect to the front part FS. When the front part FS includes a quadrangular shape in a plan view, the side parts SS may include a first side part SS1 and a third side part SS3 respectively extending from the front part FS to a first side and a second side opposite to each other in (or along) the first direction DR1. The side parts SS may further include a second side part SS2 and a fourth side part SS4 respectively extending from the front part FS to a first side and a second side opposite to each other in the second direction DR2. The first through fourth side parts SS1 through SS4 may be substantially the same in function or configuration except for position relative to edges of the front part FS.

Side surfaces of each of the side parts SS (SS1 through SS4) may include a round shape in a plan view, but the present disclosure is not limited thereto. In an embodiment, for example, side surfaces of the first side part SS1 and the third side part SS3 on the first side and the second side in the second direction DR2, respectively, may include a round shape in the plan view, but the present disclosure is not limited thereto.

Each of the first through fourth side parts SS1 through SS4 may extend from the front part FS to have a curvature and may include a round shape. The first through fourth side parts SS1 through SS4 may include a shape convex outward from the front part FS of the display device 10. In an embodiment, for example, the first side part SS1 may include a first curvature, and the second side part SS2 may include a second curvature. The third side part SS3 may include a third curvature, and the fourth side part SS4 may include a fourth curvature. The first through fourth curvatures may be the same. However, the present disclosure is not limited thereto, and the first through fourth curvatures may also be different from each other, or only some of the first through fourth curvatures may be the same.

Each of the corner parts CS may be disposed between the side parts SS (SS1 through SS4) which are adjacent to each other. In other words, the first through fourth side parts SS1 through SS4 may be spaced apart from each other in a direction along an outer edge of the front part FS, in at least some areas of the display device 10, by a distance. The corner parts CS (CS1 through CS4) may be disposed in (or at) the areas in which the first through fourth side parts SS1 through SS4 are spaced apart from each other (or disconnected from each other).

In a direction along the outer edge of the front part FS, for example, a first corner part CS1 may be disposed between the first side part SS1 and the second side part SS2, a second corner part CS2 may be disposed between the second side part SS2 and the third side part SS3, a third corner part CS3 may be disposed between the third side part SS3 and the fourth side part SS4, and a fourth corner part CS4 may be disposed between the fourth side part SS4 and the first side part SS1. The first through fourth corner parts CS1 through CS4 may be substantially the same in function or configuration except for position along the front part FS.

Each of the first through fourth corner parts CS1 through CS4 may include a double curvature and include a round shape. In an embodiment, for example, the first corner part CS1 may be disposed between the first side part SS1 and the second side part SS2. In this case, the first corner part CS1 may include a double curvature including the first curvature of the first side part SS1 and the second curvature of the second side part SS2, where the two curvatures are adjacent in a direction along the outer edge of the front part FS. The above description of the first corner part CS1 may also be applied to the second through fourth corner parts CS2 through CS4.

Pixels may be disposed on (or at) the corner parts CS, as well as the front part FS and the side parts SS of the display device 10, and a display screen may be provided at one or more of the corner parts CS. Accordingly, when the display device 10 is viewed from the front, an image may be recognized on a entirety of the display device 10 by image display at the corner parts CS, as well as the front part FS and the side parts SS of the display device 10. In other words, the image may be recognized as if there were substantially no bezel and the display device 10 may provide a more immersive display screen.

The non-display area NDA may not display an image. The non-display area NDA may not include pixels or light emitting areas. Signal lines or a scan driver for driving the pixels or the light emitting areas may be disposed in the non-display area NDA. The non-display area NDA may be adjacent to the display area DA, such as to surround the display area DA in a plan view. The non-display area NDA may be disposed outside the front part FS, the side parts SS and the corner parts CS. The non-display area NDA may form a bezel area of the display device 10. Referring to FIG. 1, the non-display area NDA may be an area of the display device 10 which is furthest from the front part FS.

Figure 3:
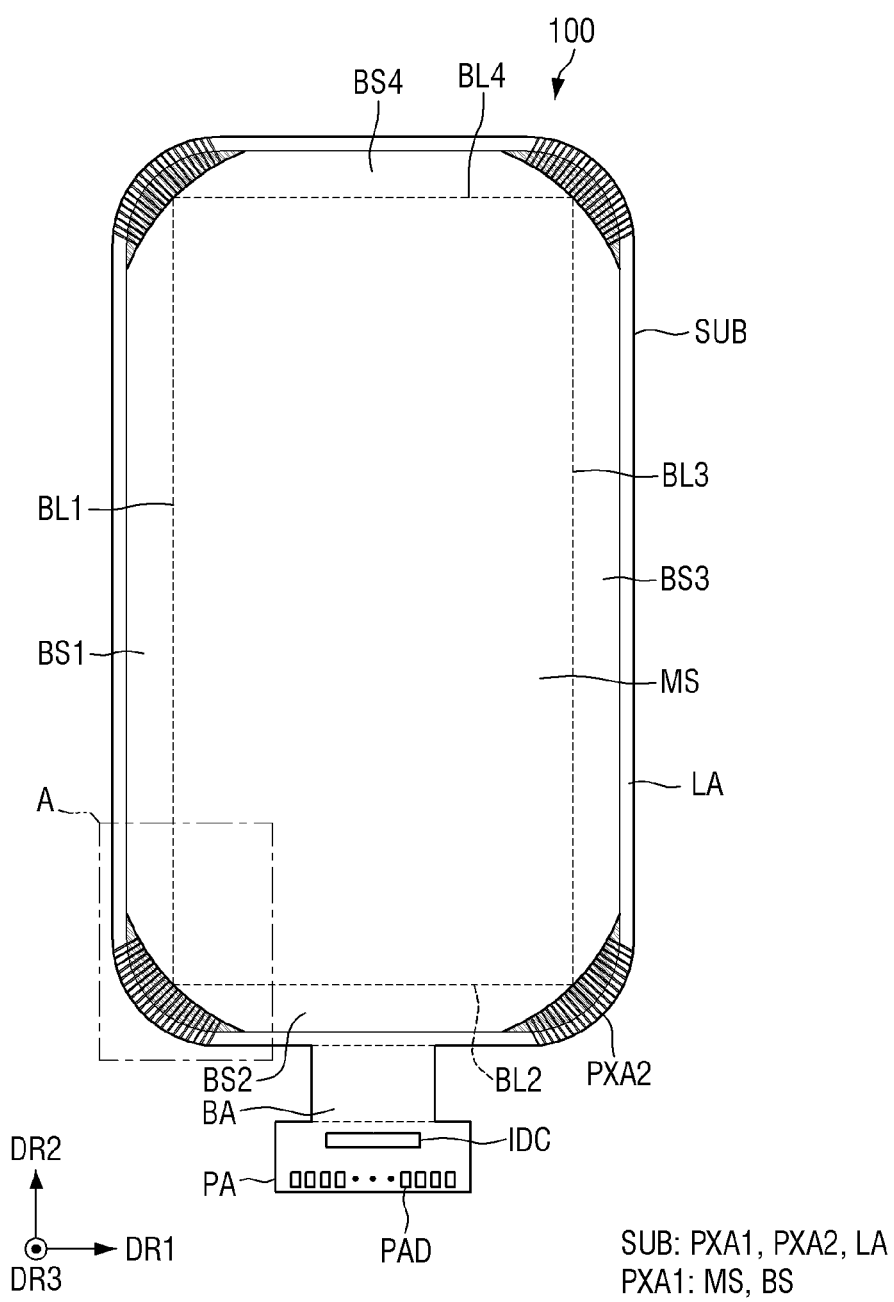
FIG. 3 is a plan view of a display panel of the display device according to an embodiment.
Figure 4:
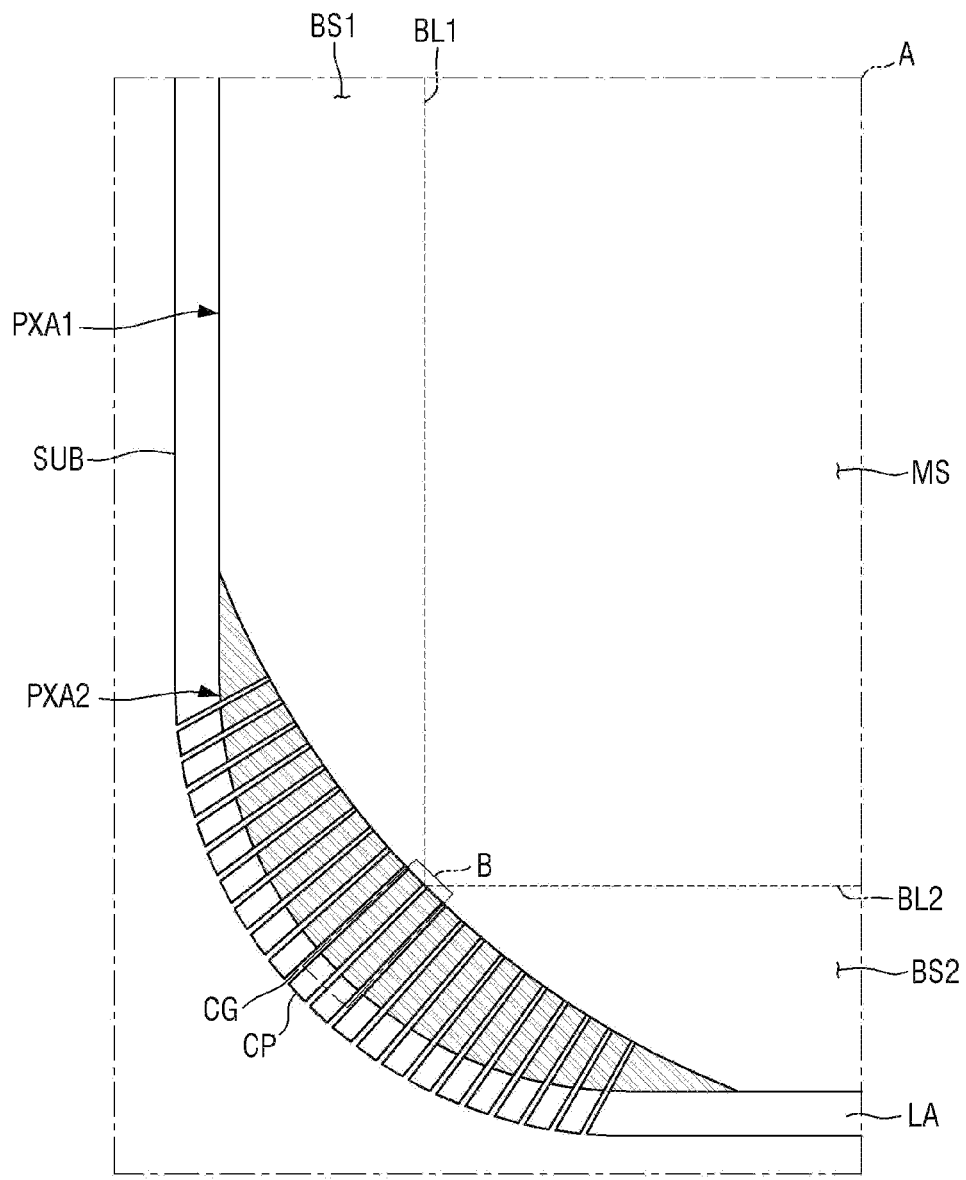
FIG. 4 is an enlarged view of area A of FIG. 3.
Figure 5:
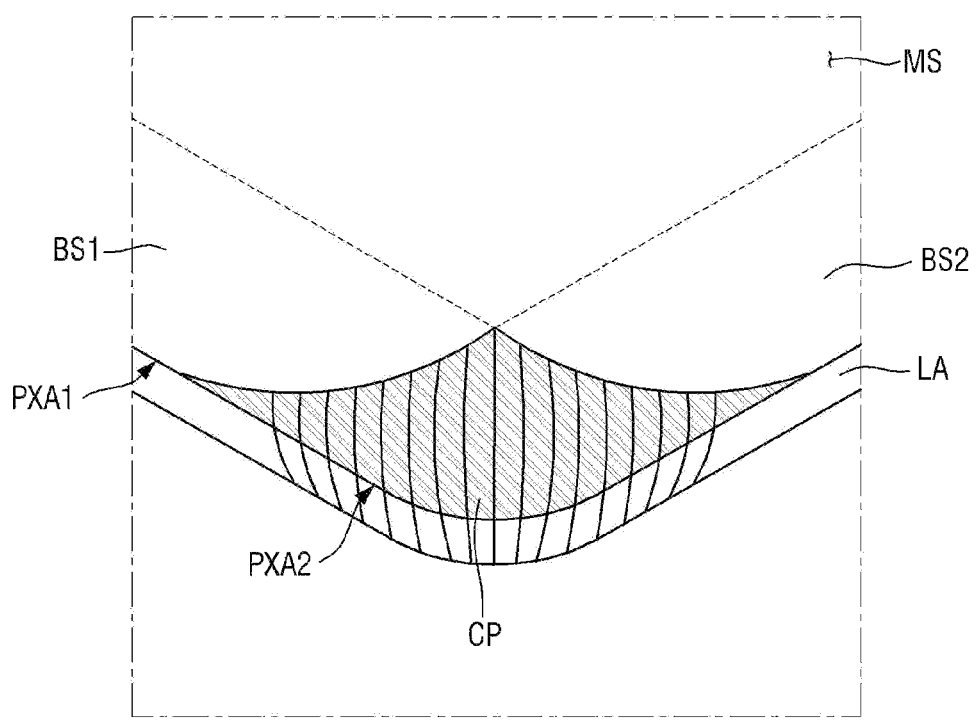
FIG. 5 is a partial perspective view of the display panel of the display device according to the embodiment.

FIG. 3 is a plan view of a display panel 100 of the display device 10 according to the embodiment. FIG. 4 is an enlarged view of area A of FIG. 3. FIG. 5 is a partial perspective view of the display panel 100 of the display device 10 according to the embodiment. FIG. 5 illustrates a case where area A of FIG. 3 is bent.

The display device 10 according to the embodiment may include the display panel 100. The display panel 100 may be a flexible display panel. In other words, the display panel 100 may be a display panel 100 that can be at least partially bent, folded, and/or rolled (e.g., bendable, foldable and/or rollable).

The display panel 100 may be a light emitting display panel including a light emitting element. In an embodiment, for example, the display panel 100 may be at least any one of an organic light emitting display panel using an organic light emitting diode as a light emitting element, a micro light emitting diode display panel using a micro light emitting diode as a light emitting element, a quantum dot organic light emitting display panel using quantum dots and an organic light emitting diode, and an inorganic light emitting display panel using an inorganic semiconductor as a light emitting element. The display panel 100 will hereinafter be described as an organic light emitting display panel.

The display panel 100 may include a substrate SUB. As will be described later, the substrate SUB may provide a space in which other elements disposed on the substrate SUB can be located and may support the elements disposed on the substrate SUB.

The substrate SUB may include a first pixel area PXA1, a second pixel area PXA2, and a non-pixel area LA. Each of the first pixel area PXA1 and the second pixel area PXA2 may include a plurality of pixels, In the non-pixel area LA, pixels may not be disposed, and wirings for driving the pixels may be disposed. The first pixel area PXA1 and the second pixel area PXA2 may correspond to the display area DA (see FIG. 1) of the display device 10 (see FIG. 1), and the non-pixel area LA may correspond to the non-display area NDA (see FIG. 1) of the display device 10 (see FIG. 1). The non-pixel area LA may be disposed outside the first pixel area PXA1 and the second pixel area. PXA2, and may surround the first pixel area PXA1 and the second pixel area PXA2 in a direction along an outer edge of the display area DA. A boundary may be defined between the first pixel area PXA1 and the second pixel area. PXA2, and between the display area DA and the non-pixel area LA.

The first pixel area PXA1 may include a main part MS and bending parts BS (BS1 through BS4). The main part MS may correspond to the front part FS (see FIG. 1) of the display device 10 (see FIG. 1), and the bending parts BS (BS1 through BS4) may correspond to the side parts SS (see FIG. 1) of the display device 10 (see FIG. 1). The shape (e.g., planar shape) of the main part MS may substantially correspond to that of the front part FS (see FIG. 1) of the display device 10 (see FIG. 1), and the shape (e.g., planar shape) of the bending parts BS (BS1 through BS4) may substantially correspond to that of the side parts SS (see FIG. 1) of the display device 10 (see FIG. 1).

The bending parts BS (BS1 through BS4) may extend outward from edges of the main part MS and may be bent at an angle relative to the main part MS. Each of first through fourth bending parts BS1 through BS4 may extend from the main part MS and may be bent along a bending line BL1, BL2, BL3 or BL4. In an embodiment, for example, the bending parts BS may be bent at an angle of about 90 degrees to less than about 180 degrees with respect to the main part MS.

The bending lines BL1 through BL4 may respectively meet each other at an intersection point CRP. The intersection point CRP may be provided in plural including a plurality of intersection points CRP. Each of the intersection points CRP of the bending lines BL1 through BL4 may be located between the first pixel area PXA1 and the second pixel area PXA2, or may be located on the boundary between the first pixel area PXA1 and the second pixel area PXA2. However, the present disclosure is not limited thereto, and each of the intersection points CRP may also be located in the first pixel area PXA1 or in the second pixel area PXA2.

When the main part MS includes a quadrangular shape in a plan view, the bending parts BS may include the first bending part BS1 and the third bending part BS3 respectively extending from the main part MS to the first side and the second side opposing each other in the first direction DR1, and include the second bending part BS2 and the fourth bending part BS4 respectively extending from the main part MS to the first side and the second side opposing each other in the second direction DR2. The first through fourth bending parts BS1 through BS4 may be substantially the same in function or configuration except for position.

Each of the first through fourth bending parts BS1 through BS4 may extend from the main part MS to include a curvature and may include a round shape. In an embodiment, for example, the first bending part BS1 may include a curvature convex toward both the first side in the first direction DR1 and a first side in the third direction DR3. The curvature of the first bending part BS1 may be, but is not limited to, substantially the same as the first curvature of the first side part SS1 of the display device 10 (see FIG. 1). The first through fourth bending parts BS1 through BS4 may include substantially the same curvature as each other. However, the present disclosure is not limited thereto, and the first through fourth bending parts BS1 through BS4 may also include different curvatures from each other.

Each of the first through fourth bending parts BS1 through BS4 may generally include a trapezoidal shape. In this case, both side surfaces of the trapezoidal shape may include a round shape. Referring to FIG. 3, for example, the first bending part BS1 may have a first side (or first edge) furthest from the main part MS, and a second side (or second edge) closest to the main part MS, along the first direction DR1. A length of the first edge of the first bending part BS1, in the second direction DR2, may be smaller than a length of the second edge of the first bending part BS1, in the second direction DR2. Side surfaces (or side edges) connecting the above two edges of the first bending part BS1, may be located on one side and the other side of the first bending part BS1 in the second direction DR2 and may include a round shape. However, the shape of the first bending part BS1 is not limited thereto. The description of the first bending part BS1 may also be applied to the second through fourth bending parts BS2 through BS4.

The second pixel area PXA2 may be disposed between the bending parts BS (BS1 through BS4) adjacent to each other along the outer edge of the main part MS. In other words, the first through fourth bending parts BS1 through BS4 may be spaced apart from each other in at least some areas by a distance. The second pixel area PXA2 may be disposed in the areas in which the first through fourth bending parts BS1 through BS4 are spaced apart from each other (e.g., are disconnected from each other).

In an embodiment, for example, the second pixel area PXA2 may be disposed in any one of an area between the first bending part BS1 and the second bending part BS2, an area between the second bending part BS2 and the third bending part BS3, an area between the third bending part BS3 and the fourth bending part BS4, and an area between the fourth bending part BS4 and the first bending part BS1.

The second pixel area PXA2 may include a double curvature and include a round shape. In an embodiment, for example, the second pixel area PXA2 located between the first bending part BS1 and the second bending part BS2 may include a double curvature including the curvature of the first bending part BS1 and the curvature of the second bending part BS2. The shape of the second pixel area PXA2 may correspond to the shape of each corner part CS of the display device 10.

The substrate SUB may include a protruding portion providing in plural as a plurality of protruding patterns CP (e.g., plurality of protruding portions). The protruding patterns CP may each protrude from a base portion of the substrate SUB at the first pixel area PXA1 (as a base part). In other words, the protruding patterns CP may protrude from at least any one of the main part MS and the bending parts BS (BS1 through BS4). The protruding patterns CP adjacent to each other (e.g., closest to each other) may be physically separated (or disconnected) from each other in at least some areas. As will be described later, the protruding patterns CP may be physically separated from each other in a direction from an uppermost layer of the display panel 100 to the substrate SUB, which is a lowermost layer, in at least some areas.

A cut part CG (or a cut pattern) may be located in a part where adjacent protruding patterns CP are physically separated from each other. That is, a space may be provided between the protruding patterns CP adjacent to each other, by the cut part CG. Accordingly, even if the second pixel area PXA2 has a double curvature, strain applied to the second pixel area PXA2 may be reduced by the cut parts CG because the protruding patterns CP of the second pixel area PXA2 can stretch and contract (e.g., move toward and away from each other). This will be described in detail later.

The display panel 100 may further include a bending area BA and a pad area PA.

The bending area BA may extend from a lower side of the non-pixel area LA and the display panel 100 and/or the display device 10 may be bendable at the bending area BA. The bending area BA may be disposed between the non-pixel area LA and the pad area PA and may connect the non-pixel area LA and the pad area PA to each other. A length of the bending area BA in the first direction DR1 may be smaller than a length of the non-pixel area LA in the first direction DR1.

The pad area PA may extend downward from the bending area BA in a plan view, that is, in a direction away from the non-pixel area LA. A length of the pad area PA in the first direction DR1 may be greater than the length of the bending area BA in the first direction DR1. However, the present disclosure is not limited thereto. The length of the pad area PA in the first direction DR1 may also be substantially the same as the length of the bending area BA in the first direction DR1.

The bending area BA may be bendable along a bending axis, such as to be bent with a curvature in a direction opposite to a display surface of the display panel 100. The display panel 100 which is bent in the bending area BA, may dispose portions of a surface of the display panel 100 inverted in the pad area PA, that is, facing different directions. That is, a surface of the display panel 100 which faces upward in the display panel 100 which is unbent or flat, may be changed to include portions facing upward, facing outward laterally through the bending area BA and then facing downward in the pad area PA.

An integrated driving circuit IDC and a pad which is provided in plural including a plurality of pads PAD, may be disposed on the pad area PA. The integrated driving circuit IDC may be formed as an integrated circuit. The integrated driving circuit IDC may be attached onto the pad area PA using a chip on glass (COG) method, a chip on plastic (COP) method, or an ultrasonic bonding method. Alternatively, the integrated driving circuit IDC may be disposed on a circuit board disposed on the pads PAD of the pad area PA.

The integrated driving circuit IDC may be electrically connected to the pads PAD of the pad area PA. The integrated driving circuit IDC may receive digital video data and timing signals, through the pads PAD of the pad area PA. The integrated driving circuit IDC may convert the digital video data into analog data voltages and output the analog data voltages to data lines of the display area DA.

The first pixel area PXA1 and the second pixel area PXA2 may include substantially the same planar structure. The first pixel area PXA1 and the second pixel area PXA2 may include different cross-sectional structures.

First, the planar structure and cross-sectional structure of the first pixel area PXA1 will be described with reference to FIGS. 6 and 7.

Figure 6:
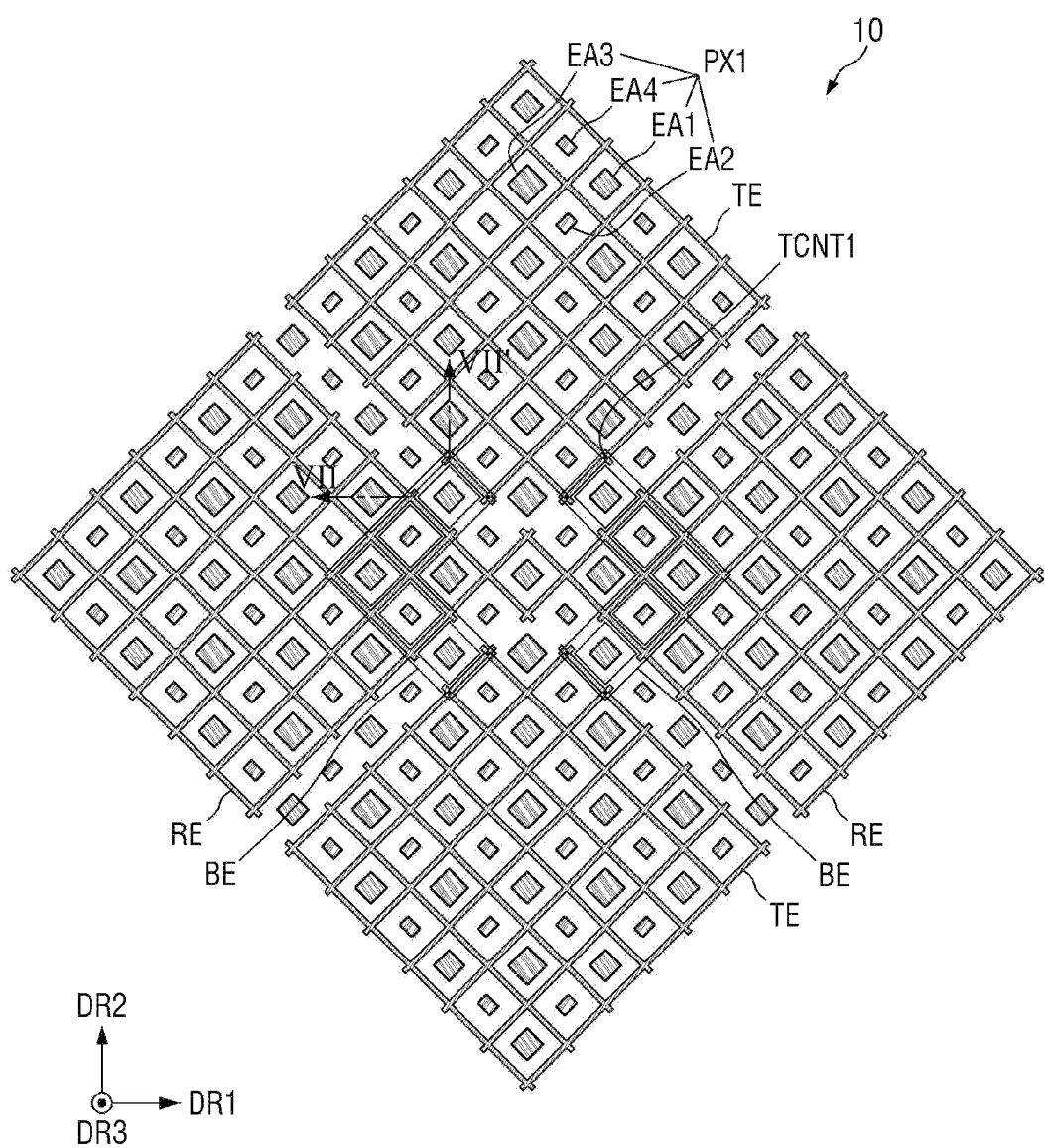
FIG. 6 is an enlarged plan view of a part of a first pixel area according to an embodiment.

FIG. 6 is an enlarged plan view of a part of a first pixel area PXA1 according to an embodiment. FIG. 7 is a cross-sectional view taken along line VII-VII' of FIG. 6. FIG. 7 illustrates the stacked structure of the first pixel area PXA1.

Figure 7:
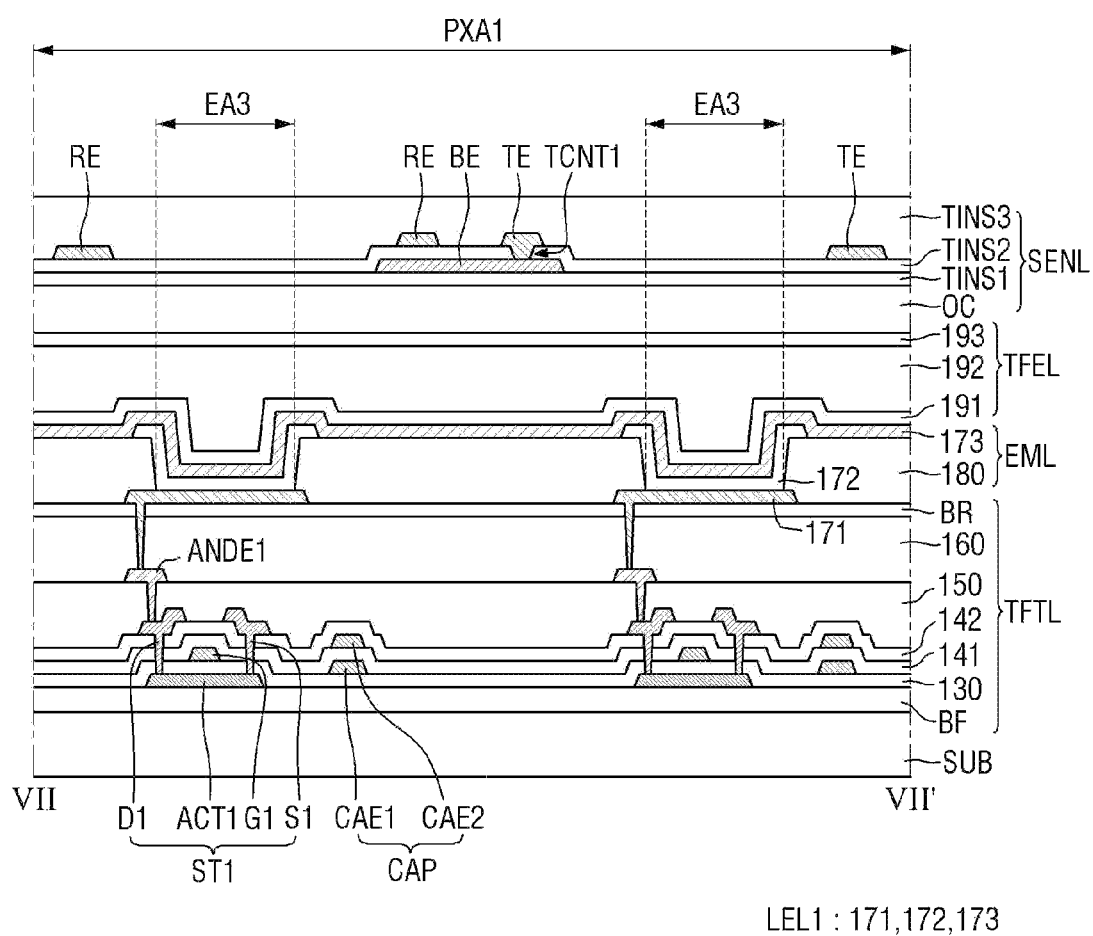
FIG. 7 is a cross-sectional view taken along line VII-VII' of FIG. 6.

Referring to FIGS. 6 and 7, the first pixel area PXA1 of the display panel 100 may include the substrate SUB, a thin-film transistor layer TFTL, a light emitting element layer EML, a thin-film encapsulation layer TFEL, and a sensor electrode layer SENL.

The substrate SUB supports each layer disposed thereon. The substrate SUB may be made of (or include) an insulating material such as polymer resin or an inorganic material such as glass or quartz. However, the present disclosure is not limited thereto, and the substrate SUB may also be a transparent plate or a transparent film.

The substrate SUB may be a flexible substrate that can be bent, folded, rolled, etc. However, the present disclosure is not limited thereto, and the substrate SUB may also be a rigid substrate.

The thin-film transistor layer TFTL is disposed on the substrate SUB. The thin-film transistor layer TFTL may include thin-film transistors, first connection electrodes ANDE1, a buffer layer BF, a gate insulating layer 130, a first interlayer insulating film 141, a second interlayer insulating film 142, a first planarization layer 150, and a second planarization layer 160.

Specifically, the buffer layer BF may be disposed on the substrate SUB. The buffer layer BF may block impurities that can be introduced from under the buffer layer BF, improve adhesion of elements disposed on the buffer layer BF, and perform a planarization function. The buffer layer BF may be made of a silicon nitride layer, a silicon oxynitride layer, a silicon oxide layer, a titanium oxide layer, or an aluminum oxide layer.

A first thin-film transistors ST1 may be provided in plural including a plurality of first thin-film transistor ST1 disposed on the buffer layer BF. Each of the first thin-film transistor ST1 may include a first active layer ACT1, a first gate electrode G1, a first source electrode S1, and a first drain electrode D1.

The first active layer ACT1 of each of the first thin-film transistors ST1 may be disposed on the buffer layer BF. The first active layer ACT1 may include a silicon semiconductor such as polycrystalline silicon, monocrystalline silicon, low-temperature polycrystalline silicon, or amorphous silicon. The first active layer ACT1 may include a channel region in a region overlapping the first gate electrode G1 in the thickness direction (the third direction DR3) and source/drain regions disposed on one side and the other side of the channel region.

The gate insulating layer 130 may be disposed on the first active layers ACT1 of the first thin-film transistors ST1. The gate insulating layer 130 may be made of an inorganic layer, for example, a silicon nitride layer, a silicon oxynitride layer, a silicon oxide layer, a titanium oxide layer, or an aluminum oxide layer.

The first gate electrodes G1 of the first thin-film transistors ST1 and first capacitor electrodes CAE1 may be disposed on the gate insulating layer 130. The first gate electrodes G1 of the first thin-film transistor ST1 may overlap the first active layers ACT1 in the third direction DR3. The first capacitor electrodes CAE1 may overlap second capacitor electrodes CAE2 in the third direction DR3. Each of the first gate electrodes G1 and the first capacitor electrodes CAE1 may be a single layer or a multilayer made of any one or more of molybdenum (Mo), aluminum (Al), chromium (Cr), gold (Au), titanium (Ti), nickel (Ni), neodymium (Nd), copper (Cu), and alloys of the same.

The first interlayer insulating film 141 may be disposed on the first gate electrodes G1 and the first capacitor electrodes CAE1. The first interlayer insulating film 141 may include an inorganic layer.

The second capacitor electrodes CAE2 may be disposed on the first interlayer insulating film 141 The second capacitor electrodes CAE2 may overlap the first capacitor electrodes CAE1 in the third direction 17R3. The first capacitor electrodes CAE1, the second capacitor electrodes CAE2, and the first interlayer insulating film 141 may firm capacitors CAP, Each of the second capacitor electrodes CAE2 may be a single layer or a multilayer made of any one or more of molybdenum (Mo), aluminum (Al), chromium (Cr), gold (Au), titanium (Ti), nickel (Ni) neodymium (Nd), copper (Cu), and alloys of the same.

The second interlayer insulating film 142 may be disposed on the second capacitor electrodes CAE2. The second interlayer insulating film 142 may include an inorganic layer.

The first source electrode S1 and the first drain electrode D1 of each of the first thin-film transistors ST1 may be disposed on the second interlayer insulating film 142. Each of the first source electrode S1 and the first drain electrode D1 may be a single layer or a multilayer made of any one or more of molybdenwn (Mo), aluminon (Al), chromium (Cr), gold (Au), titanium (Ti), nickel (Ni), neodymium (Nd), copper (Cu), and alloys of the same.

The first source electrode S1 of each of the first thin-film transistors ST1 may be connected to a conductive region disposed on one side of the channel region of the first active layer ACT1, through a contact hole passing through the gate insulating layer 130, the first interlayer insulating film 141, and the second interlayer insulating film 142. The first drain electrode D1 of each of the first thin-film transistors ST1 may be connected to a conductive region disposed on the other side of the channel region of the first active layer ACT1, through a contact hole passing through the gate insulating layer 130, the first interlayer insulating film 141, and the second interlayer insulating film 142.

The first planarization layer 150 may be disposed on the first source electrodes S1 and the first drain electrodes D1 to flatten steps due to underlying profiles of the thin-film transistors, The first planarization layer 150 may be made of an organic layer such as acryl resin, epoxy resin, phenolic resin, polyamide resin, or polyimide resin.

The first connection electrodes ANDE1 may be disposed on the first planarization layer 150. The first connection electrodes ANDE1 may be connected to the first source electrodes S1 or the first drain electrodes D1 of the first thin-film transistors ST1, through contact holes passing through the first planarization layer 150. Each of the first connection electrodes ANIDEI may be a single layer or a multilayer made of any one or more of molybdenum (Mo), aluminum (Al), chromium (Cr), gold (Au), titanium (Ti), nickel (Ni), neodymium (Nd), copper (Cu), and alloys of the same.

The second planarization layer 160 may be disposed on the first connection electrodes ANDEL The second planarization layer 160 may include an organic layer such as acryl resin, epoxy resin, phenolic resin, polyamide resin, or polyimide resin.

A barrier layer BR may be disposed on the second planarization layer 160. The barrier layer BR may include an inorganic layer.

The light emitting element layer EML is disposed on the thin-film transistor layer TFTL. The light emitting element layer EML may include first light emitting elements LEL1 and a pixel defining layer 180.

Each of the first light emitting elements LEL1 may include a pixel electrode 171, a light emitting layer 172 (e.g., first light emitting layer), and a common electrode 173. Each of light emitting areas EA1 through EA4 may be an area in which the pixel electrode 171, the light emitting layer 172, and the common electrode 173 are sequentially stacked so that holes from the pixel electrode 171 and electrons from the common electrode 173 combine together in the light emitting layer 172 to emit light. In this case, the pixel electrode 171 may be an anode, and the common electrode 173 may be a cathode. A structure of a first light emitting area EA1, a second light emitting area EA2, and a fourth light emitting area EA4 may be substantially the same as a structure of the third light emitting area EA3 illustrated in FIG. 7.

Specifically, the pixel electrodes 171 may be disposed on the barrier layer BR. The pixel electrodes 171 may be connected to the first connection electrodes ANDE1, through contact holes passing through the barrier layer BR and the second planarization layer 160.

In a top emission structure in which light is emitted from the light emitting layers 172 toward the common electrode 173, each of the pixel electrodes 171 may be formed (or provided) as a single layer of molybdenum (Mo), titanium (Ti), copper (Cu) or aluminum (Al) or, in order to increase reflectivity, may have a stacked structure (Ti/Al/Ti) of aluminum and titanium, a stacked structure (ITO/Al/ITO) of aluminum and indium tin oxide, an APC alloy, or a stacked structure (ITO/APC/ITO) of an APC alloy and indium tin oxide. The APC alloy is an alloy of silver (Ag), palladium (Pd), and copper (Cu).

The pixel defining layer 180 may define the light emitting areas EA1 through EA4. The light emitting areas EA1 through EA4 may be defined by the pixel defining layer 180 which is penetrated in the thickness direction (the third direction DR3), to define solid portions separates by an emission opening. The light emitting areas EA1 through EA4 may respectively overlap the pixel electrodes 171. A plurality of first pixels PX1 of the first pixel area PXA1 may each include a plurality of light emitting areas EA1 through EA4. In an embodiment, for example, each of the first pixels PX1 may include the first light emitting area EA1, the second light emitting area EA2, the third light emitting area EA3, and the fourth light emitting area EA4. The first light emitting area EA1, the second light emitting area EA2, the third light emitting area. EA3, and the fourth light emitting area EA4 may emit light of different colors, but the present disclosure is not limited thereto.

The pixel defining layer 180 may be formed on the barrier layer BR to expose a part of each of the pixel electrodes 171 to outside the pixel defining, layer 180. The pixel defining layer 180 may cover edges of the pixel electrodes 171. The pixel defining layer 180 may be made of an organic layer such as acryl resin, epoxy resin, phenolic resin, polyamide resin, or polyimide resin.

The light emitting layers 172 are disposed on the pixel electrodes 171 which are exposed by the pixel defining layer 180 to outside thereof. The light emitting layers 172 may include an organic material to emit light of a color. In an embodiment, for example, each of the light emitting layers 172 may include a hole injection/transporting layer, an organic material layer, and an electron injection/transporting layer. The organic material layer may include a host and a dopant. The organic material layer may include a material emitting light and may be formed using a phosphorescent material or a fluorescent material.

The common electrode 173 is disposed on the light emitting layers 172. The common electrode 173 may cover the light emitting layers 172. The common electrode 173 may be a common layer common to all pixels. A capping layer may be formed on the common electrode 173.

In the top emission structure, the common electrode 173 may be made of a transparent conductive material (TCO) capable of transmitting light, such as indium tin oxide (ITO) or indium zinc oxide (IZO), or a semi-transmissive conductive material such as magnesium (Mg), silver (Ag) or an alloy of Mg and Ag. When the common electrode 173 is made of a semi-transmissive conductive material, light output efficiency may be increased 1w a microcavity.

The thin-film encapsulation layer TFEL may be formed on the light emitting element layer EML. The thin-film encapsulation layer TFEL may include at least one inorganic layer to prevent oxygen or moisture from permeating into the light emitting element layer EML. In addition, the thin-film encapsulation layer TFEL, may include at least one organic layer to protect the light emitting element layer EMI, from particles.

In an embodiment, for example, the thin-film encapsulation layer TFEL may include a first inorganic encapsulation layer 191 disposed on the common electrode 173, an organic encapsulation layer 192 disposed on the first inorganic encapsulation layer 191, and a second inorganic encapsulation layer 193 disposed on the organic encapsulation layer 192. Each of the first inorganic encapsulation layer 191 and the second inorganic encapsulation layer 193 may be a multilayer in which one or more inorganic layers selected from a silicon nitride layer, a silicon oxynitride layer, a silicon oxide layer, a titanium oxide layer, and an aluminum oxide layer, are alternately stacked. The organic encapsulation layer 192 may include at least any one of acryl resin, epoxy resin, phenolic resin, polyamide resin, and polyimide resin.

The sensor electrode layer SENL may be disposed on the thin-film encapsulation layer TFEL. The sensor electrode layer SENL may include sensor electrodes. The sensor electrode layer SENL, may sense a touch, a proximity, a force, etc. from an input tool such as a body part or an object, using the sensor electrodes.

The sensor electrode layer SENL may include a driving electrode TE, a sensing electrode RE, and a connection electrode BE. The driving electrode TE, the sensing electrode RE, and the connection electrode BE may each be provided in plural numbers, but the present disclosure is not limited thereto.

The driving electrodes TE and the sensing electrodes RE may be electrically separated from each other. Since the driving electrodes TE and the sensing electrodes RE are formed on the same layer, they may be spaced apart from each other, A gap may be formed between the driving electrodes TE and the sensing electrodes RE. As being on a same layer, elements may be in a same layer as each other as respective portions of a same material layer, may form an interface with a same underlying or overlying layer, etc., without being limited thereto.

The sensing electrodes RE may be electrically connected to each other, in the first direction DR1. The driving electrodes TE may be electrically connected to each other, in the second direction DR2. The driving electrodes TE adjacent to each other in the second direction DR2 may be connected to each other through the connection electrodes BE so that the sensing electrodes RE and the driving electrodes TE are electrically separated at their intersections.

The connection electrodes BE may be formed on a different layer from the driving electrodes TE and the sensing electrodes RE, and may be connected to the driving electrodes TE through touch contact holes TCNT1. An end (e.g., a first end) of each of the connection electrodes BE may be connected to any one of the driving electrodes TE adjacent to each other in the second direction DR2, through the touch contact holes TCNT1. The other end (e.g., a second end opposite to the first end) of each of the connection electrodes BE may be connected to the other one of the driving electrodes TE adjacent to each other in the second direction DR2 through the touch contact holes TCNT1. The connection electrodes BE may overlap the sensing electrodes RE in the third direction DR3. Since the connection electrodes BE are formed on a different layer from the driving electrodes TE and the sensing electrodes RE, the connection electrodes BE may be electrically separated from the sensing electrodes RE even if they overlap the sensing electrodes RE in the third direction DR3.

In a plan view, the connection electrodes BE may be bent at least once. In FIG. 6, each of the connection electrodes BE is bent like a bracket ("<" or ">"), but the planar shape of each of the connection electrodes BE is not limited thereto. In addition, the driving electrodes TE adjacent to each other in the second direction DR2 may be connected to each other by a plurality of connection electrodes BE. Therefore, even if any one of the connection electrodes BE is broken, the driving electrodes TE adjacent to each other in the second direction DR2 can be electrically connected.

The driving electrodes TE and the sensing electrodes RE may each have a mesh structure or a net structure in a plan view. Solid portions of the sensing electrodes which are spaced apart from each other, may form the mesh or net structure. The driving electrodes TE and the sensing electrodes RE may not overlap the light emitting areas EA1 through EA4. As not overlapping, elements may be adjacent to or spaced apart from each other. Accordingly, it is possible to suppress or prevent light emitted from the light emitting areas EA1 through EA4 from being blocked by the driving electrodes TE and the sensing electrodes RE, thereby suppressing or preventing a reduction in the luminance of the light.

The sensor electrode layer SENL may further include an overcoat layer OC, a first touch inorganic layer TINS1, a second touch inorganic layer TINS2, and a touch organic layer TINS3, in order in a direction away from the thin-film encapsulation layer TFEL.

The overcoat layer OC may be disposed on the second inorganic encapsulation layer 193. The overcoat layer OC may be disposed between the second inorganic encapsulation layer 193 and the first touch inorganic layer TINS1. The overcoat layer OC may include at least one organic layer. In an embodiment, for example, the overcoat layer OC may be made of an organic layer such as acryl resin, epoxy resin, phenolic resin, polyainide resin, or polyimide resin.

The first touch inorganic layer TINS1 may be disposed on the overcoat layer OC. The first touch inorganic layer TINS1 may include at least one inorganic layer. The first touch inorganic layer TINS1 may be made of a silicon nitride layer, a silicon oxynitride layer, a silicon oxide layer, a titanium oxide layer, or an aluminum oxide layer.

The connection electrodes BE may be disposed on the first touch inorganic layer TINS1. The connection electrodes BE may include molybdenum (Mo), titanium (Ti), copper (Cu), or aluininwn (Al). The connection electrodes BE may include a single-layer structure or a multilayer structure such as a stacked structure (Ti/Al/Ti) of aluminum and titanium, a stacked structure (ITO/Al/TO) of aluminum and indium tin oxide, an APC alloy, or a stacked structure (ITO/APC/ITO) of an APC alloy and indium tin oxide.

The second touch inorganic layer TINS2 may be disposed on the connection electrodes BE. The second touch inorganic layer TINS2 may cover the connection electrodes BE and may be disposed on the first touch inorganic layer TINS1. The second touch inorganic layer TINS2 may include at least one inorganic layer. The second touch inorganic layer TINS2 may be made of a silicon nitride layer, a silicon oxynitride layer, a silicon oxide layer, a titanium oxide layer, or an aluminum oxide layer.

The driving electrodes TE and the sensing electrodes RE may be disposed together in a sensing electrode layer on the second touch inorganic layer TINS2. The driving electrodes TE and the sensing electrodes RE may include molybdenum (Mo), titanium (Ti), copper (Cu), or aluminum (Al). The driving electrodes TE and the sensing electrodes RE may include a single-layer structure or a multilayer structure such as a stacked structure (Ti/Al/Ti) of aluminum and titanium, a stacked structure (ITO/Al/ITO) of aluminum and, indium tin oxide, an APC alloy, or a stacked structure (ITO/APC/ITO) of an APC alloy and indium tin oxide.

The touch organic layer TINS3 may be disposed on the sensing electrode layer including both the driving electrodes TE and the sensing electrodes RE. The touch organic layer TINS3 may cover the driving electrodes TE and the sensing electrodes RE and may be disposed on the second touch inorganic layer TINS2. The touch organic layer TINS3 may include at least one organic layer. The touch organic layer TINS3 may include acry resin, epoxy resin, phenolic resin, polyamide resin, or polyimide resin.

At least any one of the overcoat layer OC and the first touch inorganic layer TINS1 may also be omitted from the first pixel area PXA1. When both the overcoat layer OC and, the first touch inorganic layer TINS1 are omitted from the first pixel area PXA1, the connection electrodes BE may be directly disposed on the second inorganic encapsulation layer 193.

The planar structure and cross-sectional structure of the second pixel area. PXA2 will now be described with reference to FIGS. 8 and 9.

Figure 8:
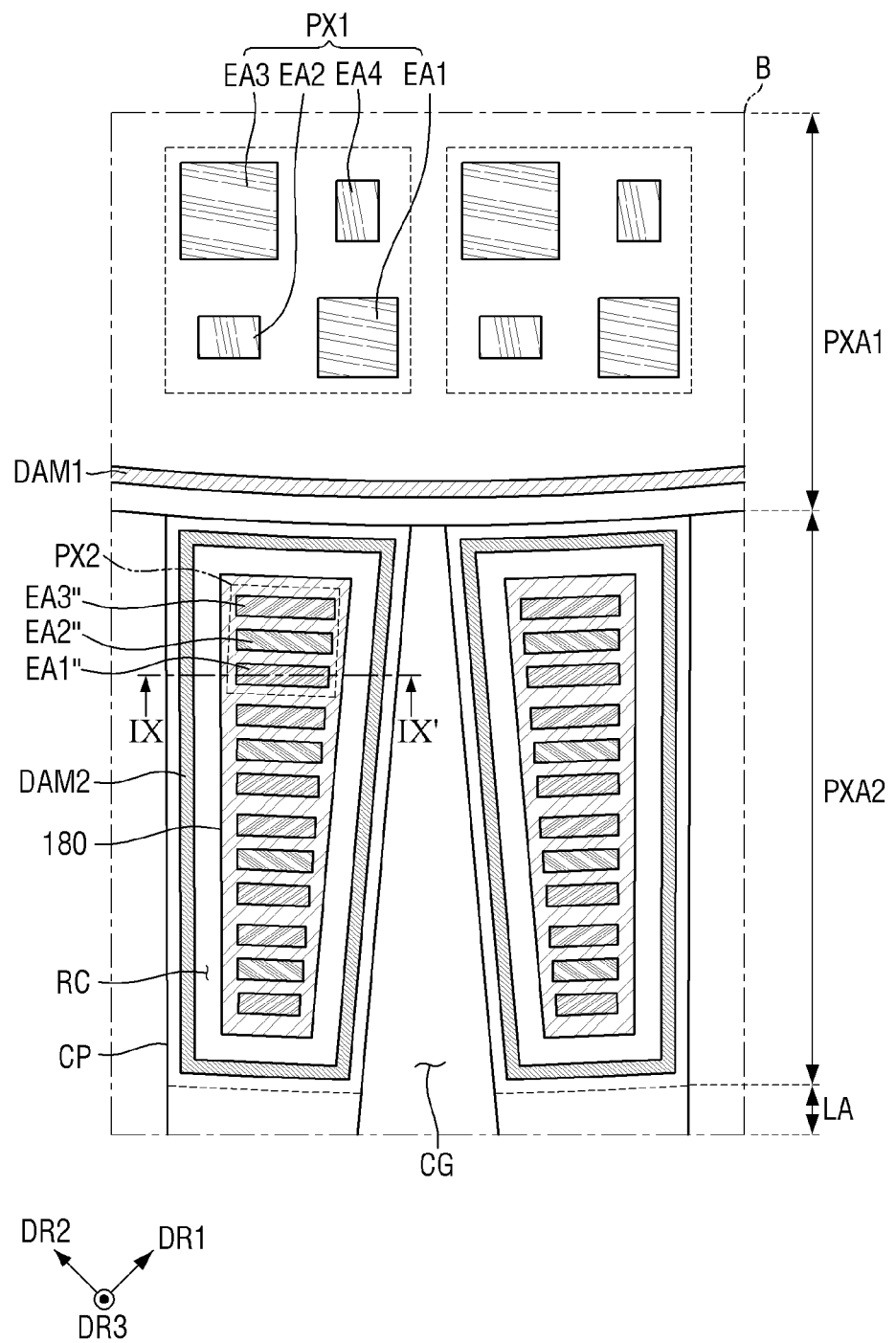
FIG. 8 is an enlarged view of area B of FIG. 4.
Figure 9:
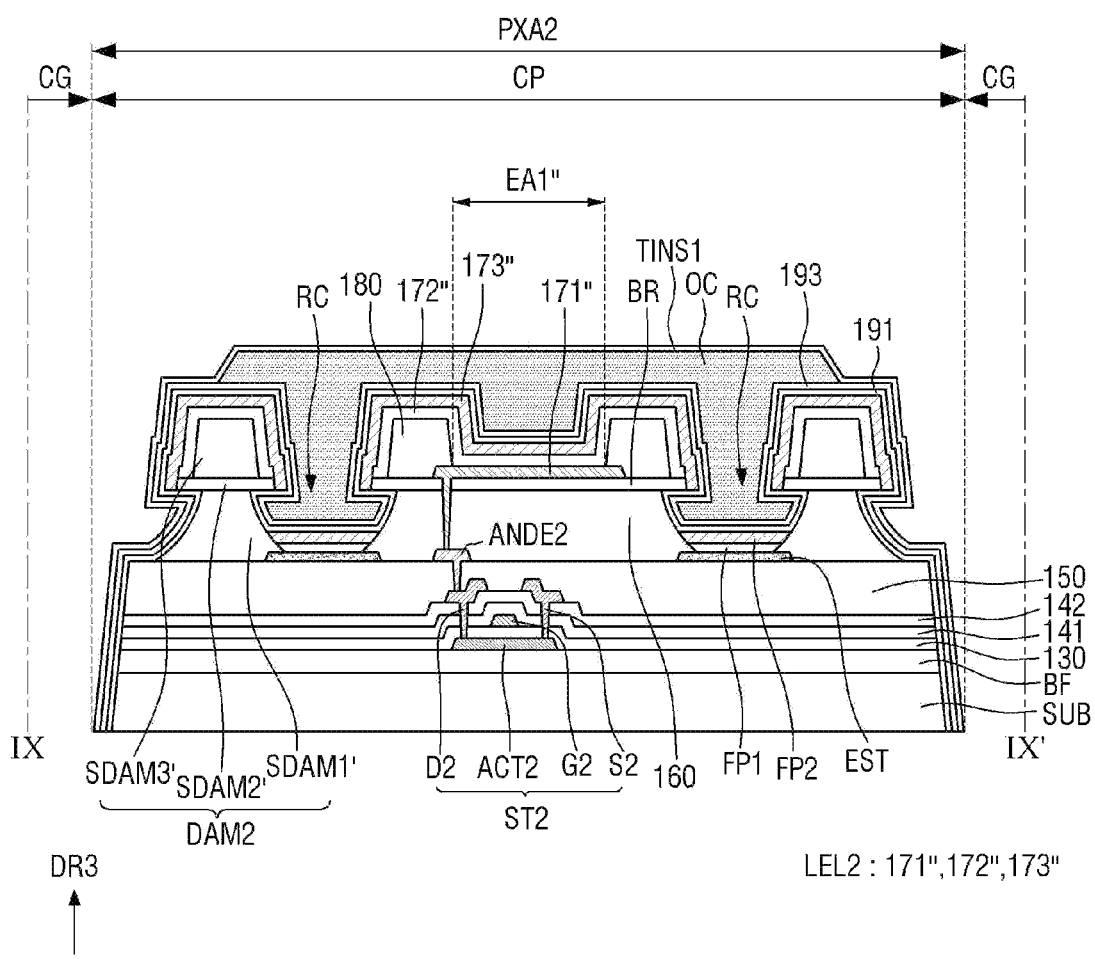
FIG. 9 is a cross-sectional view taken along line IX-IX' of FIG. 8.

FIG. 8 is an enlarged view of area B of FIG. 4. FIG. 9 is a cross-sectional view taken along line IX-IX' of FIG. 8.

FIG. 9 illustrates the stacked structure of the second pixel area PXA2. Elements and features of the stacked structure of the second pixel PXA2 which are substantially the same as those of the stacked structure of the first pixel area PXA1 will not be described below, and only differences will be described.

Referring to FIGS. 8 and 9, the first pixel area PXA1 may include a plurality of first pixels PX1, and the second pixel area PXA2 may include a plurality of second pixels PX2.

The first pixel area PXA1 may further include a first dam structure DAM1. The first dam structure DAM1 may be disposed along edges of the first pixel area PXA1, that is, along an outer edge of the first pixel area PXA1 or along a boundary between the first pixel area PXA1 and the second pixel area PXA2. The first dam structure DAM1 may surround the first pixels PX1 of the first pixel area PXA1, in a plan view. The first dam structure DAM1 may suppress or prevent an organic material layer of the first pixel area PXA1 from overflowing to the outside of the first pixel area PXA1, such as to the second pixel area PXA2.

The second pixel area PXA2 may include light emitting areas EA1" through EA3". The light emitting areas EA1" through EA3" of the second pixel area PXA2 may be defined by the pixel defining layer 180. The pixel defining layer 180 in the first pixel area PXA1 may extend to the second pixel area PXA2. The light emitting areas EA1" through EA3" may refer to light emitting areas of each of the second pixels PX2 of the second pixel area PXA2. In an embodiment, for example, each of the second pixels PX2 may include a first light emitting area EA1", a second light emitting area EA2", and a third light emitting area. EA3". The first light emitting area EA1 ", the second light emitting area EA2", and the third light emitting area EA3" may emit light of different colors, but the present disclosure is not limited thereto.

The protruding patterns CP of the substrate SUB may protrude from at least any one of the main part MS and the bending parts BS of the first pixel area PXA1, and toward the outside of the first pixel area. PXA1 (e.g., in a direction away from the main part MS and the bending parts BS). The protruding patterns CP may protrude from the first pixel area. PXA1 (or the base part). One end (e.g., a first end) of each protruding pattern CP may be connected to the first pixel area PXA1. That is, the protruding pattern. CP may be connected to the substrate SUB at the first pixel area PXA1. The non-pixel area LA may be disposed at the other end (e.g., a second end) of each protruding pattern CP which is opposite to the one end of each protruding pattern CP. A distal end of the protruding pattern CP which is furthest from the main part MS and the bending parts BS may define the non-pixel area LA of the substrate SUB.

One end of each protruding pattern CP may be connected to the first pixel area PXA1. The other end of each protruding pattern CP may be connected to and/or define the non-pixel area LA. In other words, in some areas of the display panel 100, the first pixel area PXA1 and the non-pixel area LA may be spaced apart from each other with the second pixel area PXA2 interposed between them. The protruding patterns CP of the second pixel area PXA2 may be disposed in a space between the first pixel area PXA1 and the non-pixel area LA and may connect the first pixel area PXA1 and the non-pixel area LA to each other. However, the present disclosure is not limited thereto. In an embodiment, for example, the other end of each protruding pattern CP may not be connected to the non-pixel area LA and may be exposed to the outside without being connected to a separate element.

The second pixel area PXA2 may be disposed on each protruding pattern CP between the first pixel area PXA1 and the non-pixel area LA. The non-pixel area LA may be provided for each protruding pattern CP, and the non-pixel areas LA respectively provided for the protruding patterns CP may be separated and spaced apart from each other along the boundary between the first pixel area PXA1 and the second pixel area PXA2.

Each protruding pattern CP may be exposed, except for a part connected to the first pixel area PXA1. The protruding patterns CP may have different lengths in a direction in which the protruding patterns CP protrude from the first pixel area PXA1. An end of the first pixel area PXA1 from which the protruding patterns CP protrude, may include a curve in the plan view. In this case, the protruding patterns CP may protrude in different directions in the plan view. However, the present disclosure is not limited thereto.

Each of the protruding patterns CP may have a length in a direction normal to the curved end of the first pixel area PXA1, and a width crossing the length, such as being perpendicular thereto. The length of each protruding pattern CP in the direction in which the protruding pattern CP protrudes from the first pixel area PXA1, may be greater than a width of the protruding pattern CP in a direction perpendicular to the protruding direction.

The width of each of the protruding patterns CP may decrease in a direction from the first pixel area PXA1 toward the non-pixel area LA. In this case, each of the protruding patterns CP may include a trapezoidal shape in a plan view, but the present disclosure is not limited thereto.

The protruding patterns CP may face each other in a direction along the end of the first pixel area PXA1. In other words, the protruding patterns CP may be spaced apart from each other along the end of the first pixel area PXA1, with the cut part CO interposed therebetween. EaCh of the protruding patterns CP include side surfaces opposing each other in the direction along the end of the first pixel area PXA1. The side surfaces of one of the protruding patterns CP, may face a respective side surface of an adjacent protruding pattern.

The protruding patterns CP may be separated from each other by the cut part CG. A distance between the protruding patterns CP adjacent to each other, may increase in a direction from the first pixel area PXA1 toward the non-pixel area LA. That is, a width of the cut part (Xi may increase in a direction from the first pixel area PXA1 toward the non-pixel area LA.

When the protruding patterns CP are bent along the third direction DR3, the distance between the protruding patterns CP adjacent to each other may be reduced, or the protruding patterns CP adjacent to each other may directly contact each other at respective side surfaces thereof. When the protruding patterns CP adjacent to each other directly contact each other, a physical interface (or boundary) may be located between the protruding patterns CP adjacent to each other, at the respective side surfaces. However, the present disclosure is not limited thereto. When the protruding patterns CP adjacent to each other are bent, they may also overlap each other. Furthermore, when the protruding patterns CP are bent, a distance between the second pixels PX2 disposed on each protruding pattern CP may be reduced.

In addition, when an outermost protruding pattern CP among the protruding patterns CP within a same one of the second pixel areas PXA2 is bent, it may directly contact an adjacent bending part BS1, BS2, BS3 or BS4. In this case, a physical interface (or boundary) may be located between the outermost protruding pattern CP and the first pixel area PXA1 (e.g., at a respective bending part) adjacent to the outermost protruding pattern CP and disposed in the bending part BS1, BS2, BS3 or BS4.

When the protruding patterns CP are bent, they may include a double curvature and include a round shape. In other words, the protruding patterns CP may include substantially the same double curvature as the second pixel area PXA2 and may include a round shape.

The second pixel area PXA2 may further include a second dam structure DAM2. The second dam structure DAM2 may be disposed along outer edges of each protruding pattern CP of the second pixel area PXA2. In other words, the second dam structure DAM2 may be disposed in each protruding pattern CP and may surround a group of the second pixels PX2 disposed on each protruding pattern CP. The second dam structure DAM2 may suppress or prevent an organic material layer of each protruding pattern CP of the second pixel area PXA2 from overflowing to the outside of each protruding pattern CP of the second pixel area PXA2.

The second pixel area PXA2 may include the substrate SUB, the buffer layer BF, the gate insulating layer 130, the first interlayer insulating film 141, the second interlayer insulating film 142, the first planarization layer 150, the second planarization layer 160, and the pixel defining layer 180. These elements are substantially the same as those described in the first pixel area PXA1, and thus a description thereof will be omitted.

The second pixel area PXA2 may include a second thin-film transistor ST2 and a second light emitting element LEL2. A display structure or display element may include a transistor and a light emitting element connected to each other, such as the second thin-film transistor ST2 and the second light emitting element LEL2. The second thin-film transistor ST2 may include a second active layer ACT2, a second gate electrode G2, a second source electrode S2, and a second drain electrode D2. The second thin-film transistor ST2 may include substantially the same configuration as the first thin-film transistors ST1 of the first pixel area PXA1 of FIG. 7. Therefore, a detailed description of the second thin-film transistor ST2 will be omitted.

The display device 10 may further include an etch stop pattern EST. The etch stop pattern EST may be disposed on the first planarization layer 150. The etch stop pattern EST may overlap a recess pattern RC in the thickness direction (the third direction DR3). The etch stop pattern EST may be exposed to outside a layered structure on the substrate SUB, by the recess pattern RC. The etch stop patterns EST may include an inorganic material, but the present disclosure is not limited thereto. The etch stop pattern EST may be disposed around the second dam structure DAM2 and may serve as an etch stopper in the process of forming (or forming) the second dam structure DAM2.

Furthermore, a conductive line electrically connected to the second pixels PX2 to apply a voltage or transmit a signal thereto, may be disposed under the etch stop pattern EST. In this case, the etch stop pattern EST may prevent the conductive line thereunder from being damaged by etching. At least a part of the etch stop pattern EST may overlap the second dam structure DAM2 in the thickness direction (the third direction DR3).

The second light emitting element LEL2 of the second pixel area PXA2 may include a pixel electrode 171", a light emitting layer 172" (e.g., second light emitting layer), and a common electrode 173". The second light emitting element LEL2 of the second pixel area PXA2 may include substantially the same configuration as the first light emitting elements LEL1 of the light emitting element layer EML of FIG. 7. Therefore, a description of the second light emitting element LEL2 of the second pixel area PXA2 will be omitted. Furthermore, the pixel electrode 171" of the second light emitting element LEL2 and the second drain electrode D2 of the second thin-film transistor ST2 may be electrically connected by a second connection electrode ANDE2 disposed on the first planarization layer 150.

The second pixel area PXA2 may further include the first inorganic encapsulation layer 191 and the second inorganic encapsulation layer 193 of the thin-film encapsulation layer TFEL (see FIG. 7) and may not include the organic encapsulation layer 192 (see FIG. 7). The first inorganic encapsulation layer 191 and the second inorganic encapsulation layer 193 of the second pixel area PXA2 may include substantially the same configuration as the first inorganic encapsulation layer 191 and the second inorganic encapsulation layer 193 of the first pixel area PXA1, and thus a description thereof will be omitted. That is, various layers of the first pixel area PXA1, such as the first inorganic encapsulation layer 191 and the second inorganic encapsulation layer 193 may extend from the first pixel area PXA1 to the second pixel area PXA2.

Various layers on the substrate SUB at the protruding pattern CP, may include side surfaces together width side surfaces of the substrate SUB, to define cut surfaces or side surfaces of the protruding pattern CP. In addition, the first inorganic encapsulation layer 191 and the second inorganic encapsulation layer 193 may be disposed on (or along) cut surfaces or side surfaces of each protruding pattern CP which are defined by various layers thereof.

In an embodiment, for example, the first inorganic encapsulation layer 191 and the second inorganic encapsulation layer 193 may be disposed on cut surfaces or side surfaces of the substrate SUB, the buffer layer BF, the gate insulating layer 130, the first interlayer insulating film 141, the second interlayer insulating film 142, and the first planarization layer 150 of each protruding pattern CP. Therefore, it is possible to prevent moisture or oxygen from being introduced through the cut surfaces or side surfaces of each protruding pattern CP and damaging the light emitting layer 172".

In the second pixel area PXA2, the second dam structure DAM2 may be disposed on the first planarization layer 150. The second dam structure DAM2 may include a first sub-dam SDAM1' including the same material as the second planarization layer 160, a second sub-dam SDAM2' including the same material as the barrier layer BR, and a third sub-dam SDAM3' including the same material as the pixel defining layer 180. The first sub-dam SDAM1', the second sub-dam SDAM2', and the third sub-dam SDAM3' may be sequentially stacked in order from the first planarization layer 150.

The second pixel area PXA2 may further include the recess pattern RC. The recess pattern RC may be respectively disposed between the second dam structure DAM2 and the light emitting areas EA1" through EA3" (or the light emitting layer 172") in a plan view. In other words, the recess pattern RC may be located outside the light emitting areas EA1" through EA3" (or the light emitting layer 172") of the second pixels PX2 in a plan view and may be located inside the second dam structure DAM2 in the plan view. The recess pattern RC may surround the pixel defining layer 180 in the plan view and may surround the light emitting areas EA1" through EA3" (or the light emitting layer 172") of the second pixels PX2 in the plan view, but the present disclosure is not limited thereto.

When the recess pattern RC surrounds the light emitting areas EA1" through EA3" (or the light emitting layer 172"), the second planarization layer 160 and the first sub-dam SDAM1' as planarization patterns, may be separated from each other in each protruding pattern CP, and the second planarization layer 160 may include an island shape (e.g., a discrete shape in the plan view). In addition, the barrier layer BR and the second sub-dam SDAM2' are separated from each other in each protruding pattern CP, and the barrier layer BR may include an island shape. However, the present disclosure is not limited thereto. In an embodiment, when the recess pattern RC does not surround the light emitting areas EA1" through EA3" (or the light emitting layer 172") in a plan view, the second planarization layer 160 and the first sub-dam SDAM1' may be connected to each other, and the barrier layer BR and the second sub-dam SDAM2' may be connected to each other in an area where the recess pattern RC is not disposed.

The recess pattern RC may be defined by solid portions or patterns of the barrier layer BR, the second planarization layer 160, the first sub-dam SDAM1', and the second sub-dam SDAM2'. In this case, sidewalls of the recess pattern RC may be defined by or composed of sidewalls of each of the barrier layer BR, the second planarization layer 160, the first sub-dam SDAM1', and the second sub-dam SDAM2' (e.g., a stacked sidewall structure). However, the present disclosure is not limited thereto, and the sidewalls of the recess pattern RC may further include the pixel defining layer 180 and the third sub-dam SDAM3'. The recess pattern RC may expose the etch stop pattern EST to outside a stacked sidewall structure. The recess pattern RC may have, but is not limited to, an undercut shape. Specifically, side surfaces of the barrier layer BR may protrude further outward than side surfaces of the second planarization layer 160, in a direction along the first planarization layer 150. Here, 'outward' may refer to a direction toward the center of the recess pattern RC or a direction away from a sidewall of the recess pattern RC toward the other sidewall of the recess pattern RC which faces the above sidewall. In other words, the side surfaces of the barrier layer BR may protrude further toward the center of the recess pattern RC than the side surfaces of the second planarization layer 160. A distance between facing side surfaces of the barrier layer BR and the second sub-dam SDAM2' at the recess pattern RC, may be smaller than a distance between facing side surfaces of the second planarization layer 160 and the first sub-dam SDAM1'.

A dummy light emitting layer FP1 may be disposed in the recess pattern RC. The dummy light emitting layer FP1 may be disposed on the etch stop pattern EST exposed by the recess pattern RC. When the recess pattern RC has an undercut shape, the light emitting layer 172" may not be disposed on the sidewalls of the recess pattern RC. Therefore, the light emitting layer 172" may be separated from the dummy light emitting layer FP1. The dummy light emitting layer FP1 may be a remaining part of the light emitting layer 172" which is separated from the light emitting layer 172" without being connected to the light emitting layer 172". The dummy light emitting layer FP1 may be made of the same material as the light emitting layer 172".

Due to the recess pattern RC, the light emitting layer 172" of each second pixel PX2 of the second pixel area PXA2 may be separated from the dummy light emitting layer FP1 disposed in the recess pattern RC. In addition, the penetration of outside air and moisture into the light emitting layer 172" of each second pixel PX2 of the second pixel area PXA2 may be suppressed or prevented by the dummy light emitting layer FP1. Therefore, the reliability of the second pixels PX2 of the second pixel area PXA2 can be improved.

A dummy common electrode layer FP2 may be disposed in the recess pattern RC. The dummy common electrode layer FP2 may be disposed on the dummy light emitting layer FP1. When the recess pattern RC has an undercut shape, the common electrode 173" may not be disposed on the sidewalls of the recess pattern RC. Therefore, the common electrode 173" may be separated from the dummy common electrode layer FP2. The dummy common electrode layer FP2 may be a remaining part of the common electrode 173" which is separated from the common electrode 173" without being connected to the common electrode 173". The dummy common electrode layer FP2 may be made of the same material as the common electrode 173".

The first inorganic encapsulation layer 191 may be disposed on the dummy common electrode layer FP2 in the recess pattern RC and may cover the dummy common electrode layer FP2. The first inorganic encapsulation layer 191 may be disposed on the side surfaces of the second planarization layer 160 defining the recess pattern RC and may also be disposed on the other surface (lower surface) of the barrier layer BR protruding toward the recess pattern RC. That is, the first inorganic encapsulation layer 191 may cover the second planarization layer 160 and the barrier layer BR exposed by the common electrode 173" and the dummy common electrode layer FP2. The barrier layer BR protruding toward the recess pattern RC may directly contact the first inorganic encapsulation layer 191, thereby facilitating encapsulation.

On each protruding pattern CP and/or in the second pixel area PXA2, the second inorganic encapsulation layer 193 may be disposed on the first inorganic encapsulation layer 191, and the organic encapsulation layer 192 (see FIG. 7) may not be disposed between the first inorganic encapsulation layer 191 and the second inorganic encapsulation layer 193. The second inorganic encapsulation layer 193 may directly contact the first inorganic encapsulation layer 191 on an entirety of the area of each protruding pattern CP.

In other words, in the light emitting areas EA1" through EA3" of the second pixel area PXA2, the second inorganic encapsulation layer 193 may be disposed on the first inorganic encapsulation layer 191, and the first inorganic encapsulation layer 191 and the second inorganic encapsulation layer 193 may directly contact each other. The first inorganic encapsulation layer 191 and the second inorganic encapsulation layer 193 may directly contact each other in an area overlapping the light emitting layer 172". On the pixel defining layer 180, the second inorganic encapsulation layer 193 may be disposed on the first inorganic encapsulation layer 191, and the first inorganic encapsulation layer 191 and the second inorganic encapsulation layer 193 may directly contact each other. At least a part of the second inorganic encapsulation layer 193 may be disposed in the recess pattern RC. In the recess pattern RC, the second inorganic encapsulation layer 193 may be disposed on the first inorganic encapsulation layer 191, and the first inorganic encapsulation layer 191 and the second inorganic encapsulation layer 193 may directly contact each other. On the dummy common electrode layer FP2, the second inorganic encapsulation layer 193 may be disposed on the first inorganic encapsulation layer 191, and the first inorganic encapsulation layer 191 and the second inorganic encapsulation layer 193 may directly contact each other.

The overcoat layer OC may be disposed on the second inorganic encapsulation layer 193 in the second pixel area PXA2. The overcoat layer OC may fill the recess pattern RC.

The overcoat layer OC may not be disposed beyond the second dam structure DAM2. The first touch inorganic layer TINS1 may be disposed on the overcoat layer OC in the second pixel area PXA2 and may be disposed on the second inorganic encapsulation layer 193 outside the second dam structure DAM2 to encapsulate the overcoat layer OC.

Since the overcoat layer OC is disposed on the second inorganic encapsulation layer 193, even if the organic encapsulation layer 192 (see FIG. 7) is not disposed between the first inorganic encapsulation layer 191 and the second inorganic encapsulation layer 193 in the second pixel area PXA2, flexibility can be secured, and planarization is possible. In other words, since the overcoat layer OC including an organic material is disposed on the second inorganic encapsulation layer 193, the flexibility of the protruding patterns CP can be secured even if the organic encapsulation layer 192 (see FIG. 7) is omitted. In addition, an upper surface of the overcoat layer OC may be generally flat despite a step difference thereunder. Therefore, even if the organic encapsulation layer 192 (see FIG. 7) is omitted, elements can be disposed on the overcoat layer OC more smoothly.

When the overcoat layer OC is disposed in the second pixel area PXA2, it may further include at least any one of a negative type photosensitive material (or sensitizer) and a positive type photosensitive material (or sensitizer). The overcoat layer OC may be patterned by a photoresist process. This will be described in detail later.

When the overcoat layer OC includes a photosensitive material and is patterned by exposure and development, a process dispersion defect can be suppressed or prevented compared with when an organic layer (the overcoat layer OC) disposed on the second light emitting element LEL2 of the second pixel area PXA2 is applied using an inkjet method. In other words, when the overcoat layer OC includes a photosensitive material and is patterned by exposure and development, it can be formed at a desired position compared with when it is applied using the inkjet method. The organic encapsulation layer 192 (see FIG. 7) may be applied using the inkjet method. When the organic encapsulation layer 192 (see FIG. 7) is omitted from the second pixel area PXA2, the overcoat layer OC is formed on the second inorganic encapsulation layer 193, and the overcoat layer OC is patterned by a photoresist process, a process dispersion defect of the organic layer (the overcoat layer OC) disposed on the second light emitting element LEL2 of the second pixel area PXA2 can be suppressed or prevented.

Therefore, it is possible to suppress or prevent a defect in which the organic layer (the overcoat layer OC) disposed on the second light emitting element LEL2 of the second pixel area PXA2 goes beyond the second dam structure DAM2. The second light emitting element LEL2 of the second pixel area PXA2 can be encapsulated by the first inorganic encapsulation layer 191, the second inorganic encapsulation layer 193, the overcoat layer OC and the first touch inorganic layer TINS1, and an encapsulation defect of the second light emitting element LEL2 of the second pixel area PXA2 due to the process dispersion of the organic layer (the overcoat layer OC) can be suppressed or prevented. Furthermore, the reliability of the second light emitting element LEL2 of the second pixel area PXA2 can be improved.

Although not illustrated, the connection electrodes BE (see FIG. 7), the second touch inorganic layer TINS2 (see FIG. 7), the driving electrodes TE (see FIG. 7), the sensing electrodes RE (see FIG. 7), and the touch organic layer TINS3 (see FIG. 7) may be further disposed on the first touch inorganic layer TINS1 (see FIG. 7) in the second pixel area PXA2. Accordingly, a touch of a person or an object can also be sensed in the second pixel area PXA2.

A method of manufacturing a display device 10 according to an embodiment will now be described.

FIGS. 10 through 13 are cross-sectional views for explaining a method of manufacturing (or providing) a display device 10 according to an embodiment. FIGS. 10 through 13 illustrate cross sections of an area around a protruding pattern CP (e.g., protruding portion of the display device 10).

Figure 10:
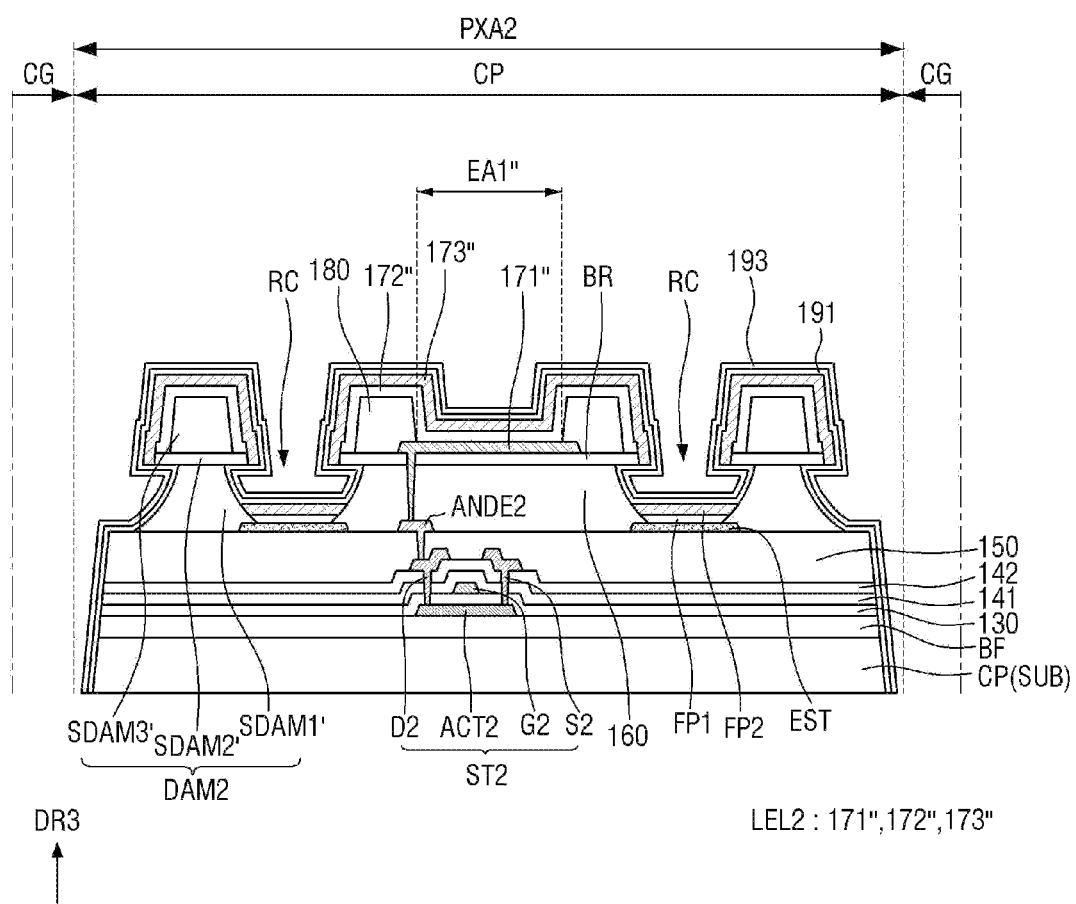
FIGS. 10 through 13 are cross-sectional views for explaining a method of manufacturing (or providing) a display device according to an embodiment.

Referring to FIG. 10, a first inorganic encapsulation layer 191 and a second inorganic encapsulation layer 193 are formed on the protruding pattern CP.

Specifically, a buffer layer BF, a gate insulating layer 130, a first interlayer insulating film 141, a second interlayer insulating film 142, a first planarization layer 150, an etch stop pattern EST, a second planarization layer 160, a barrier layer BR, a pixel electrode 171" of a second light emitting element LEL2, a pixel defining layer 180, a light emitting layer 172" of the second light emitting element LEL2, and a common electrode 173" of the second light emitting element LEL2 are sequentially formed on the protruding pattern CP of the substrate SUB, to provide a display structure at a curved-corner display area. In addition, a second thin-film transistor ST2 electrically connected to the pixel electrode 171" of the second light emitting element LEL2 may also be formed.

A recess pattern RC (e.g., recess) may be formed by removing portions of the pixel defining layer 180, the barrier layer BR, and the second planarization layer 160 at locations adjacent to a light emitting area defined by solid portions of the pixel defining layer 180. Specifically, the recess pattern RC may be formed to expose a part of a lower surface of the barrier layer BR which is closest to the substrate SUB, like an eaves structure having an undercut, by removing the second planarization layer 160 using the barrier layer BR as a mask. The etch stop pattern EST may be exposed to outside a sidewall structure of the pixel defining layer 180, the barrier layer BR, and the second planarization layer 160, by (or at) the recess pattern RC.

A dummy light emitting layer FP1 may be formed on the etch stop pattern EST, in the recess pattern RC, in the process of forming the light emitting layer 172" of the second light emitting element LEL2, and a dummy common electrode layer FP2 may be formed on the dummy light emitting layer FP1, in the recess pattern RC, in the process of forming the common electrode 173" of the second light emitting element LEL2.

The first inorganic encapsulation layer 191 is formed on the common electrode 173" of the second light emitting element LEL2. The first inorganic encapsulation layer 191 may be formed over an entirety of the substrate SUB. The first inorganic encapsulation layer 191 may be disposed on the common electrode 173" of the second light emitting element LEL2, may be disposed in the recess pattern RC, and may be disposed along outer side surfaces of the various layers which respectively face the cut parts CG.

The second inorganic encapsulation layer 193 is disposed on the first inorganic encapsulation layer 191. An organic encapsulation layer 192 (see FIG. 7) may be omitted between the first inorganic encapsulation layer 191 and the second inorganic encapsulation layer 193, on the protruding pattern CP. The second inorganic encapsulation layer 193 may be formed over an entirety of the substrate SUB, along the first inorganic encapsulation layer 191. Since the organic encapsulation layer 192 (see FIG. 7) on the protruding pattern CP is omitted, the first inorganic encapsulation layer 191 and the second inorganic encapsulation layer 193 disposed on the protruding pattern CP may directly contact each other.

Figure 11:
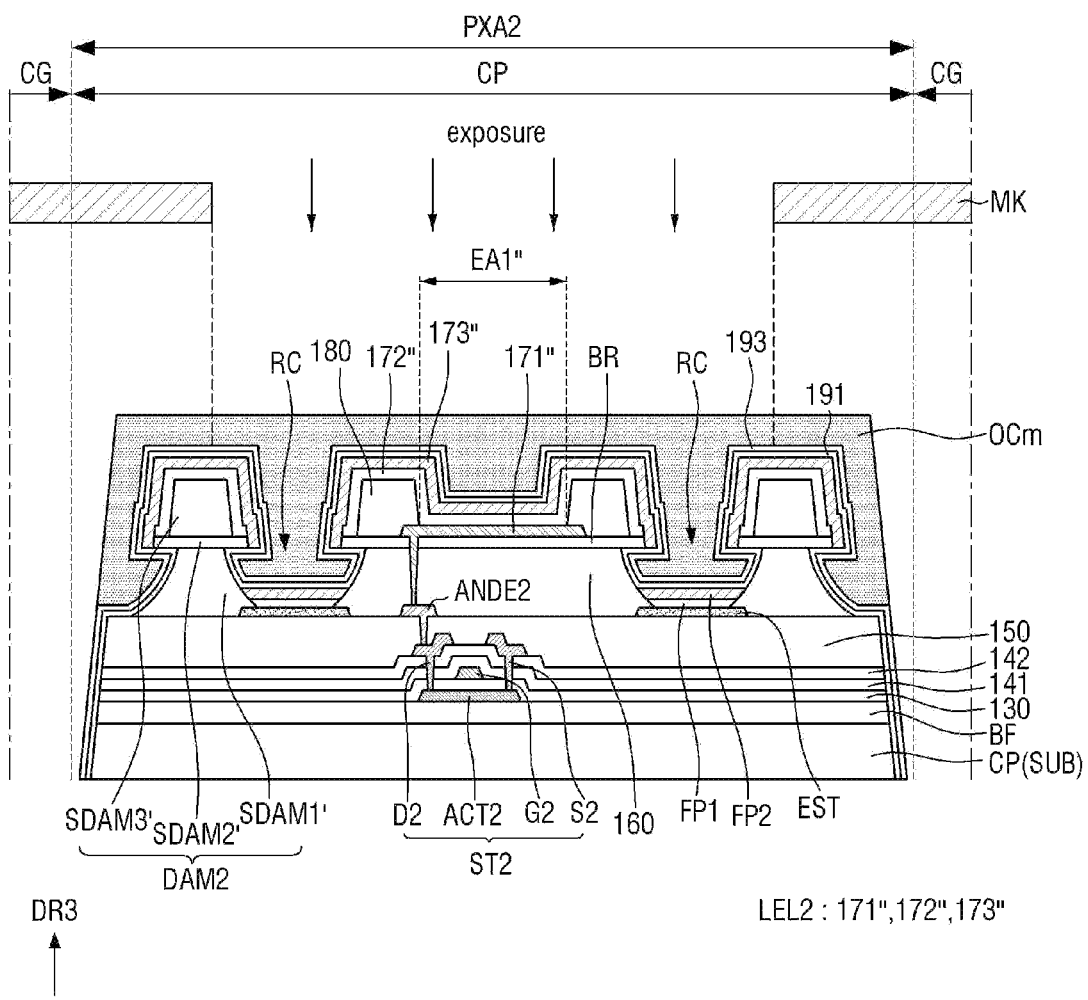
Figure 12:
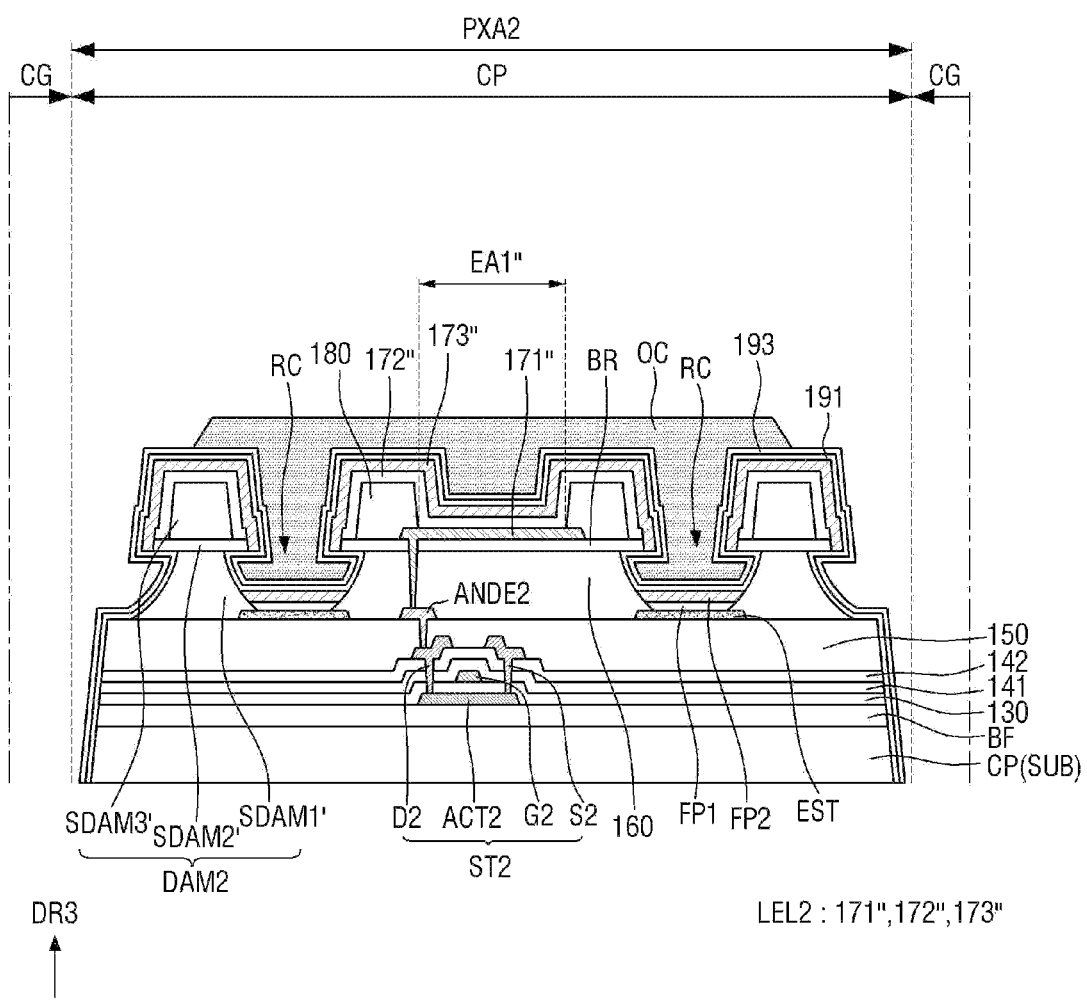

Referring to FIGS. 11 and 12, an overcoat layer material layer OCm (or an organic photosensitive layer) is applied on the second inorganic encapsulation layer 193 over an entirety of the protruding pattern CP and is patterned by exposure or lithography and development into an overcoat layer OC.

Specifically, the overcoat layer material layer OCm is applied on the second inorganic encapsulation layer 193, over the entire area of the protruding pattern CP. Then, a part of the overcoat layer material layer OCm which is exposed to outside a photomask MK, is exposed to light through the photomask MK partially exposing the overcoat layer material layer OCm ('exposure' in FIG. 11).

In this case, when the overcoat layer material layer OCm includes a negative photosensitive material (sensitizer), the exposed part of the overcoat layer material layer OCm (the part exposed to outside the photomask MK) is hardened and thus does not dissolve well in a developer. Here, any one part of the overcoat layer material layer OCm may be selectively removed using a developer according to chemical changes of a part exposed to light and a part not exposed to light. Accordingly, the overcoat layer OC may be patterned. That is, when the overcoat layer material layer OCm includes a negative photosensitive material (sensitizer), the exposed part of the overcoat layer material layer OCm may correspond to the overcoat layer OC.

When the overcoat layer OC is patterned by a photoresist process including exposure and development, it can be placed at a desired position more precisely, and a process dispersion defect of an organic layer (the overcoat layer OC) disposed on the second light emitting element LEL2 can be suppressed or prevented.

However, the present disclosure is not limited thereto. When the overcoat layer material layer OCm includes a positive photosensitive material (sensitizer), the exposed part may be removed by a developer. Therefore, in this case, a part of the overcoat layer material layer OCm which does not correspond to the overcoat layer OC may be exposed and removed by development.

Figure 13:
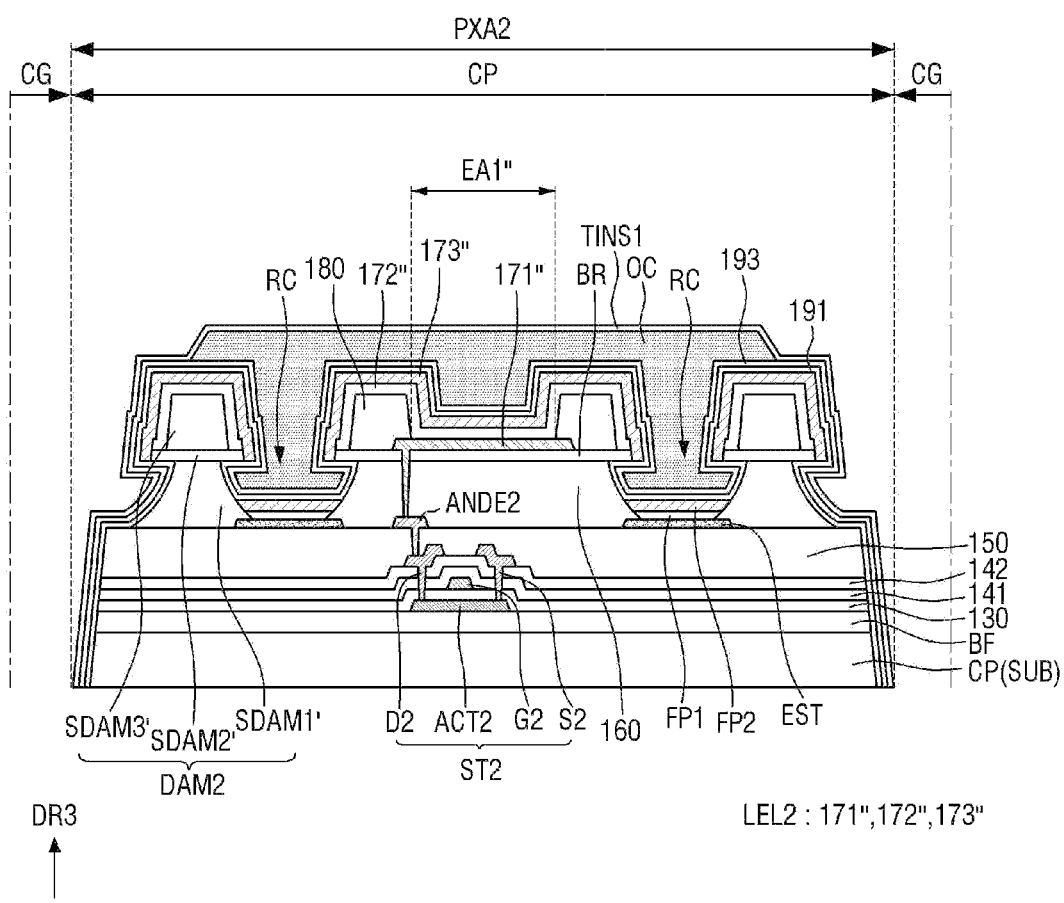

Referring to FIG. 13, a first touch inorganic layer TINS1 is formed on the patterned overcoat layer OC. The first touch inorganic layer TINS1 may be disposed over an entirety of the protruding pattern CP. The first touch inorganic layer TINS1 may be disposed on the second inorganic encapsulation layer 193 to cover the overcoat layer OC, thereby encapsulating the overcoat layer OC.

Hereinafter, other embodiments will be described. In the following embodiments, a description of the same elements as those of the above-described embodiment will be omitted or given briefly, and differences will be mainly described.

Figure 14:
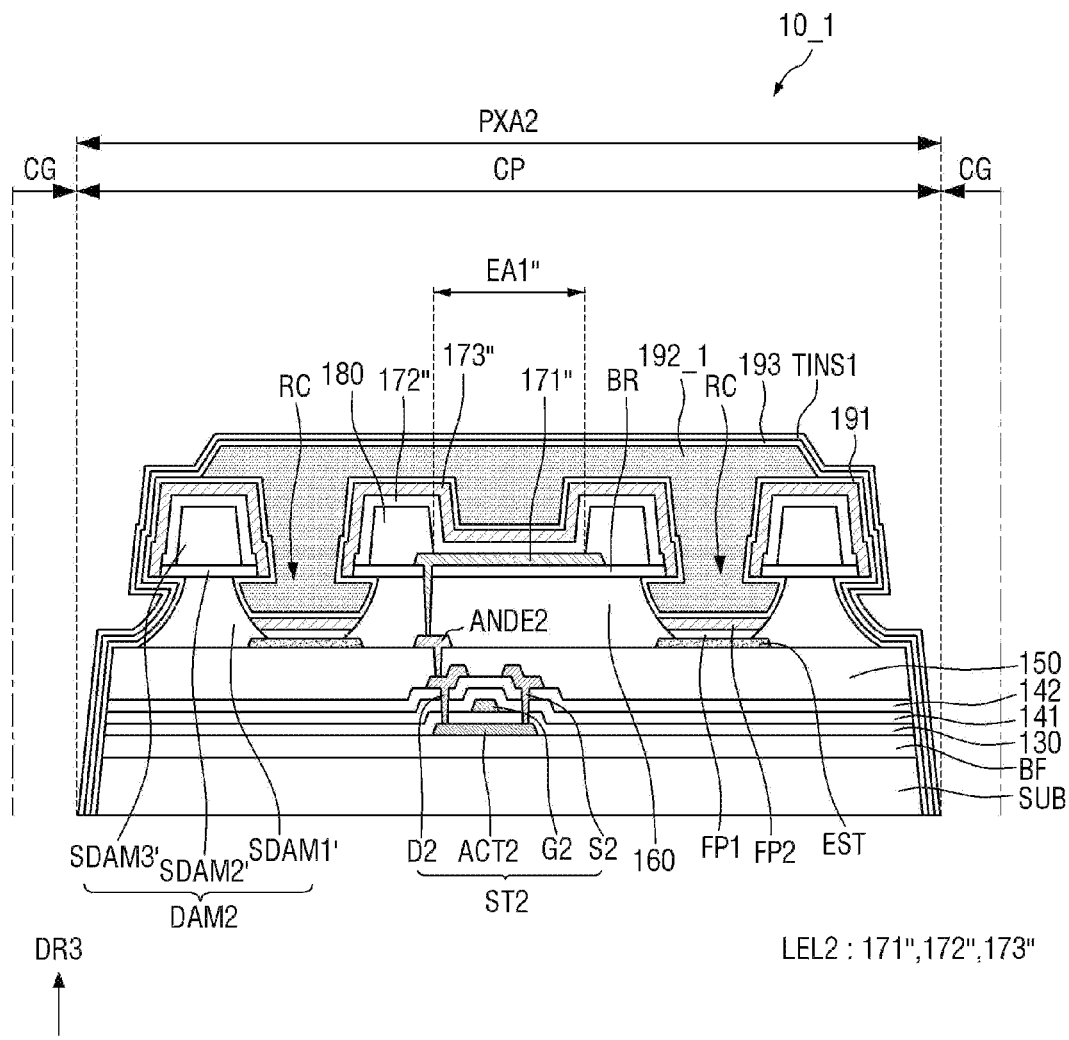
FIG. 14 is a cross-sectional view of a display device according to an embodiment.

FIG. 14 is a cross-sectional view of a display device 10_1 according to an embodiment. FIG. 14 illustrates a cross section of an area around a protruding pattern CP.

Referring to FIG. 14, an organic encapsulation layer 192_1 is disposed in a second pixel area PXA2 of the display device 10_1 and includes at least any one of a negative type photosensitive material (or sensitizer) and a positive type photosensitive material (or sensitizer).

When the organic encapsulation layer 192_1 includes a sensitizer, the organic encapsulation layer 192_1 disposed on the protruding pattern CP may be patterned through exposure and development and may be precisely disposed at a desired position compared with when the organic encapsulation layer 192_1 is applied using an inkjet method.

Therefore, when the organic encapsulation layer 192_1 is patterned by a photoresist process, a process dispersion defect of an organic layer (the organic encapsulation layer 192_1) disposed on a second light emitting element LEL2 of the second pixel area PXA2 can be suppressed or prevented. Furthermore, the reliability of the second light emitting element LEL2 can be improved. In this case, an overcoat layer OC (see FIG. 9) may be omitted. In addition, an organic encapsulation layer 192 (see FIG. 9) of a first pixel area PXA1 (see FIG. 7) may include the same sensitizer as the organic encapsulation layer 192_1 of the second pixel area PXA2.

In one or more embodiment according to the invention, the reliability of the display device 10 or the display device 10_1 can be improved.

However, the effects of the present disclosure are not restricted to the one set forth herein. The above and other effects of the present disclosure will become more apparent to one of daily skill in the art to which the present disclosure pertains by referencing the claims.

The invention should not be construed as being limited to the embodiments set forth herein. Rather, these embodiments are provided so that this disclosure will be thorough and complete and will fully convey the concept of the invention to those skilled in the art.

While the invention has been particularly shown and described with reference to embodiments thereof, it will be understood by those of ordinary skill in the art that various changes in form and details may be made therein without departing from the spirit or scope of the invention as defined by the following claims.

What is claimed is:

1. An electronic device comprising:
a display device comprising:
a substrate which comprises a base part, and a protruding portion which is curved from the base part; and
on the protruding portion of the substrate:
a pixel electrode;
a pixel defining layer which is on the pixel electrode, defines a light emitting area and exposes the pixel electrode to outside the pixel defining layer at the light emitting area;
a light emitting layer which is on the pixel electrode, at the light emitting area;
a common electrode which is on the light emitting layer;
a first inorganic encapsulation layer which is on the common electrode;
a second inorganic encapsulation layer which is on the first inorganic encapsulation layer; and
an organic layer which is on the second inorganic encapsulation layer,
wherein the first inorganic encapsulation layer and the second inorganic encapsulation layer are in direct contact with each other, at the light emitting area.

2. The electronic device of claim 1, wherein the organic layer comprises a negative photosensitive material or a positive photosensitive material.

3. The electronic device of claim 2, wherein the display device further comprises an inorganic layer which faces the first inorganic encapsulation layer with the organic layer therebetween.

4. The electronic device of claim 1, wherein the display device further comprises on the protruding portion of the substrate:

a planarization layer which is between the protruding portion of the substrate and the pixel electrode; and a recess which is defined by the pixel defining layer together with the planarization layer, wherein the first inorganic encapsulation layer and the second inorganic encapsulation layer extend into the recess and are in direct contact with each other within the recess.

5. The electronic device of claim 4, wherein the display device further comprises on the protruding portion of the substrate, an etch stop pattern which is between the protruding portion of the substrate and the planarization layer, wherein the recess exposes the etch stop pattern to outside the pixel defining layer and the planarization layer.

6. The electronic device of claim 5, wherein the display device further comprises on the protruding portion of the substrate, between the etch stop pattern and the first inorganic encapsulation layer:

a dummy light emitting layer which comprises a same material as the light emitting layer; and a dummy common electrode which comprises a same material as the common electrode.

7. The electronic device of claim 4, wherein in a direction along the protruding portion of the substrate, the recess surrounds the light emitting area.

8. The electronic device of claim 1, wherein the substrate further comprises a boundary defined between the base part and the protruding portion, and the protruding portion of the substrate comprises a double curvature in a direction along the boundary which is defined between the base part and the protruding portion.

9. The electronic device of claim 8, wherein the protruding portion of the substrate is provided in plural including a plurality of protruding portions each curved from the base part, and the plurality of protruding portions are disconnected from each other along the boundary which is defined between the base part and the protruding portion.

10. The electronic device of claim 1, wherein the display device further comprises a display area, and a non-display area which is adjacent to the display area and defines a boundary with the display area, wherein the display area comprises a front part, a first side part extending bent from the front part in a first direction, a second side part extending bent from the front part in a second direction intersecting the first direction, and a corner part between the first side part and the second side part in a direction along the boundary, and the protruding portion of the substrate corresponds to the corner part of the display device.

11. An electronic device comprising:

a substrate which comprises a base part, and a protruding portion which is curved from the base part;

a plurality of first pixels on the base part of the substrate, each of the plurality of first pixels comprising a first light emitting layer;

a plurality of second pixels on the protruding portion of the substrate, each of the plurality of second pixels comprise a second light emitting layer; and on the protruding portion of the substrate:

a first inorganic encapsulation layer which is on the second light emitting layer of the plurality of second pixels; and an organic layer which is on the first inorganic encapsulation layer and comprises a negative photosensitive material or a positive photosensitive material.

12. The electronic device of claim 11, wherein the display device further comprises on the protruding portion of the substrate, in order from the second light emitting layer, the first inorganic encapsulation layer, a second inorganic encapsulation layer and the organic layer.

13. The electronic device of claim 12, wherein on the protruding portion of the substrate, in an area overlapping the second light emitting layer of the plurality of second pixels, the first inorganic encapsulation layer and the second inorganic encapsulation layer are in direct contact with each other.

14. The electronic device of claim 11, wherein the display device further comprises on the protruding portion of the substrate, in order from the second light emitting layer, the first inorganic encapsulation layer, the organic layer and a second inorganic encapsulation layer.

15. The electronic device of claim 11, wherein the substrate further comprises a boundary defined between the base part and the protruding portion, and the protruding portion of the substrate comprises a double curvature in a direction along the boundary which is defined between the base part and the protruding portion.

16. The electronic device of claim 15, wherein the protruding portion of the substrate is provided in plural including a plurality of protruding portions each curved from the base part, and the plurality of protruding portions are disconnected from each other along the boundary which is defined between the base part and the protruding portion.

17. The electronic device of claim 11, wherein the display device further comprises a display area, and a non-display area which is adjacent to the display area and defines a boundary with the display area, wherein the display area comprises a front part, a first side part extending bent from the front part in a first direction, a second side part extending bent from the front part in a second direction intersecting the first direction, and a corner part between the first side part and the second side part in a direction along the boundary, and the protruding portion of the substrate corresponds to the corner part of the display device.

* * * * *